US009977611B2

(12) United States Patent
Sekido

(10) Patent No.: US 9,977,611 B2
(45) Date of Patent: May 22, 2018

(54) STORAGE DEVICE, METHOD, AND COMPUTER-READABLE MEDIUM FOR SELECTING A WRITE DESTINATION OF TARGET DATA TO NONVOLATILE MEMORIES HAVING DIFFERENT ERASE LIMITS BASED UPON A WRITE INTERVAL

(71) Applicants: KABUSHIKI KAISHA TOSHIBA, Minato-ku (JP); TOSHIBA SOLUTIONS CORPORATION, Kawasaki-shi (JP)

(72) Inventor: Kazunori Sekido, Kunitachi (JP)

(73) Assignees: KABUSHIKI KAISHA TOSHIBA, Minato-ku (JP); TOSHIBA SOLUTIONS CORPORATION, Kawasaki-shi (JP)

(*) Notice: Subject to any disclaimer, the term of this patent is extended or adjusted under 35 U.S.C. 154(b) by 2 days.

(21) Appl. No.: 15/266,771

(22) Filed: Sep. 15, 2016

(65) Prior Publication Data

US 2017/0003892 A1    Jan. 5, 2017

Related U.S. Application Data

(63) Continuation of application No. PCT/JP2014/082137, filed on Dec. 4, 2014.

(51) Int. Cl.
*G06F 13/00* (2006.01)
*G06F 3/06* (2006.01)
(Continued)

(52) U.S. Cl.
CPC .......... *G06F 3/0616* (2013.01); *G06F 3/0608* (2013.01); *G06F 3/0652* (2013.01);
(Continued)

(58) Field of Classification Search
CPC .. G06F 3/0616; G06F 12/0246; G06F 3/0652; G06F 3/0608; G06F 12/1009;
(Continued)

(56) References Cited

U.S. PATENT DOCUMENTS

2008/0140918 A1   6/2008   Sutardja
2009/0300269 A1   12/2009  Radke et al.
(Continued)

FOREIGN PATENT DOCUMENTS

JP    2010-512569    4/2010
JP    2011-503768    1/2011
(Continued)

OTHER PUBLICATIONS

International Search Report dated Feb. 17, 2015 in PCT/JP2014/082137, filed on Dec. 4, 2014 (with English Translation).
(Continued)

*Primary Examiner* — Hong Kim
(74) *Attorney, Agent, or Firm* — Oblon, McClelland, Maier & Neustadt, L.L.P.

(57) ABSTRACT

According to one embodiment, a storage device includes a storage, first data in which a sequence number indicating a write-completion order is associated with each erase unit area included in areas of the storage, second data indicating a relationship between each write interval and each write destination, a selection module which obtains the erase unit area corresponding to a logical address of target data to be written, calculates a write interval of the target data from a difference between the sequence number at an occurrence time of writing and the sequence number corresponding to the erase unit area of the first data, and selects the write destination corresponding to the write interval of the target data, and a write module which writes the target data to the
(Continued)

selected write destination, and changes the sequence number when writing is completed for one erase unit area.

7 Claims, 22 Drawing Sheets

(51) Int. Cl.
    *G06F 12/06*     (2006.01)
    *G06F 12/16*     (2006.01)
    *G06F 12/1009*     (2016.01)
    *G11C 16/10*     (2006.01)
    *G11C 16/34*     (2006.01)
    *G06F 12/02*     (2006.01)
    *G11C 16/16*     (2006.01)
    *G11C 16/04*     (2006.01)

(52) U.S. Cl.
    CPC ........ *G06F 3/0679* (2013.01); *G06F 12/0246* (2013.01); *G06F 12/06* (2013.01); *G06F 12/1009* (2013.01); *G06F 12/16* (2013.01); *G11C 16/10* (2013.01); *G11C 16/3495* (2013.01); *G06F 2212/1036* (2013.01); *G06F 2212/2022* (2013.01); *G06F 2212/7201* (2013.01); *G06F 2212/7205* (2013.01); *G06F 2212/7208* (2013.01); *G06F 2212/7211* (2013.01); *G11C 16/0483* (2013.01); *G11C 16/16* (2013.01); *G11C 2211/5648* (2013.01)

(58) Field of Classification Search
    CPC ........ G06F 3/0679; G06F 12/06; G06F 12/16; G06F 2212/1036; G06F 2212/7205; G06F 2212/7208; G06F 2212/7211; G06F 2212/2022; G06F 2212/7201; G11C 16/10; G11C 16/3495; G11C 2211/5648; G11C 16/0483; G11C 16/16
    USPC .............................................. 711/103, 4, 170
    See application file for complete search history.

(56) References Cited

U.S. PATENT DOCUMENTS

2010/0115183 A1*   5/2010   Araki .................. G06F 12/0246
                                                                   711/103
2012/0191900 A1     7/2012   Kunimatsu et al.

FOREIGN PATENT DOCUMENTS

| | | |
|---|---|---|
| JP | 2011-522350 | 7/2011 |
| JP | 2011-186556 | 9/2011 |
| JP | 2011-186561 | 9/2011 |
| WO | WO 2009/067138 A1 | 5/2009 |

OTHER PUBLICATIONS

Written Opinion dated Feb. 17, 2015 in PCT/JP2014/082137, filed on Dec. 4, 2014.

* cited by examiner

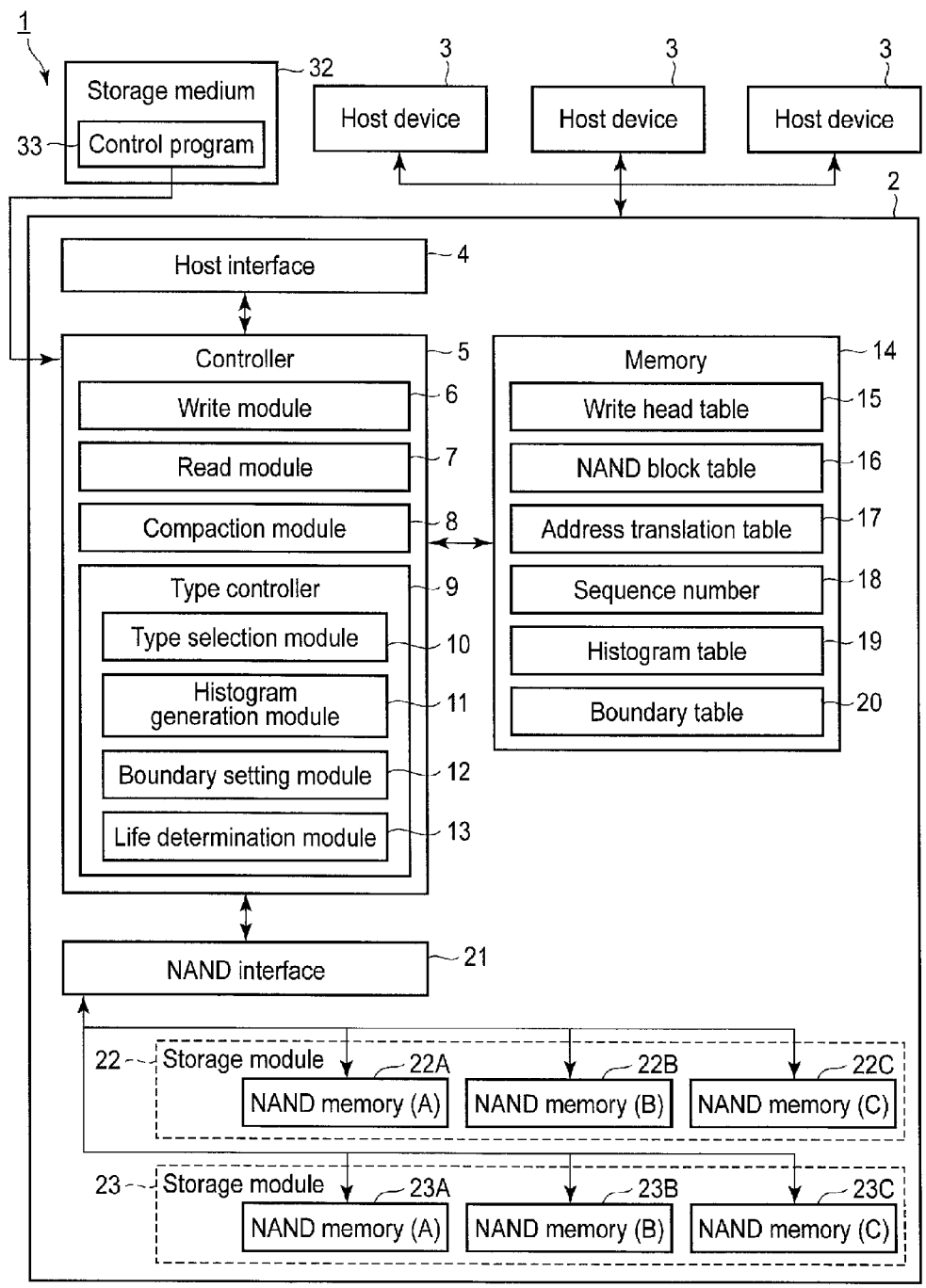
F I G. 1

| Write head table |||
|---|---|---|
| Type | Block number | Page number |
| A | 123 | 22 |
| B | 1056889 | 2 |
| C | 6743447 | 120 |

F I G. 2

| NAND block table ||||||
|---|---|---|---|---|---|
| Block number | Number of valid pages | Sequence number | Number of erases | Type | Upper limit in number of erases |
| 0 | 56 | 876 | 123 | A | 10000 |
| 1 | 65 | 1234 | 45 | A | 10000 |
| ⋮ | ⋮ | ⋮ | ⋮ | A | 10000 |
| 999999 | 0 | -1 | 98 | A | 10000 |
| 1000000 | 18 | 99880 | 23 | B | 3000 |
| ⋮ | ⋮ | ⋮ | ⋮ | B | 3000 |
| 2999999 | 0 | -1 | 30 | B | 3000 |
| 3000000 | 32 | 9876544 | 10 | C | 300 |
| ⋮ | ⋮ | ⋮ | ⋮ | C | 300 |
| 9999999 | 0 | -1 | 2 | C | 300 |

F I G. 3

| Address translation table | | |
|---|---|---|
| Logical address | Block number | Page number |
| 0 | 123456 | 6 |
| 1 | 35635 | 65 |
| 2 | 7357568 | 23 |
| 3 | 95 | 156 |
| ⋮ | ⋮ | ⋮ |

F I G. 4

| Histogram table | |
|---|---|
| Difference in sequence number / D | Number of writes |
| 0 | 0 |
| 1 | 0 |
| ⋮ | ⋮ |
| 1500000 | 1234 |
| 1500001 | 12 |
| ⋮ | ⋮ |
| More than or equal to 3000000 | 4565 |

F I G. 5

| Boundary table | |
|---|---|
| Type | Boundary value |
| A | 2000000 |
| B | 6000000 |
| C | -1 |

20

F I G. 6

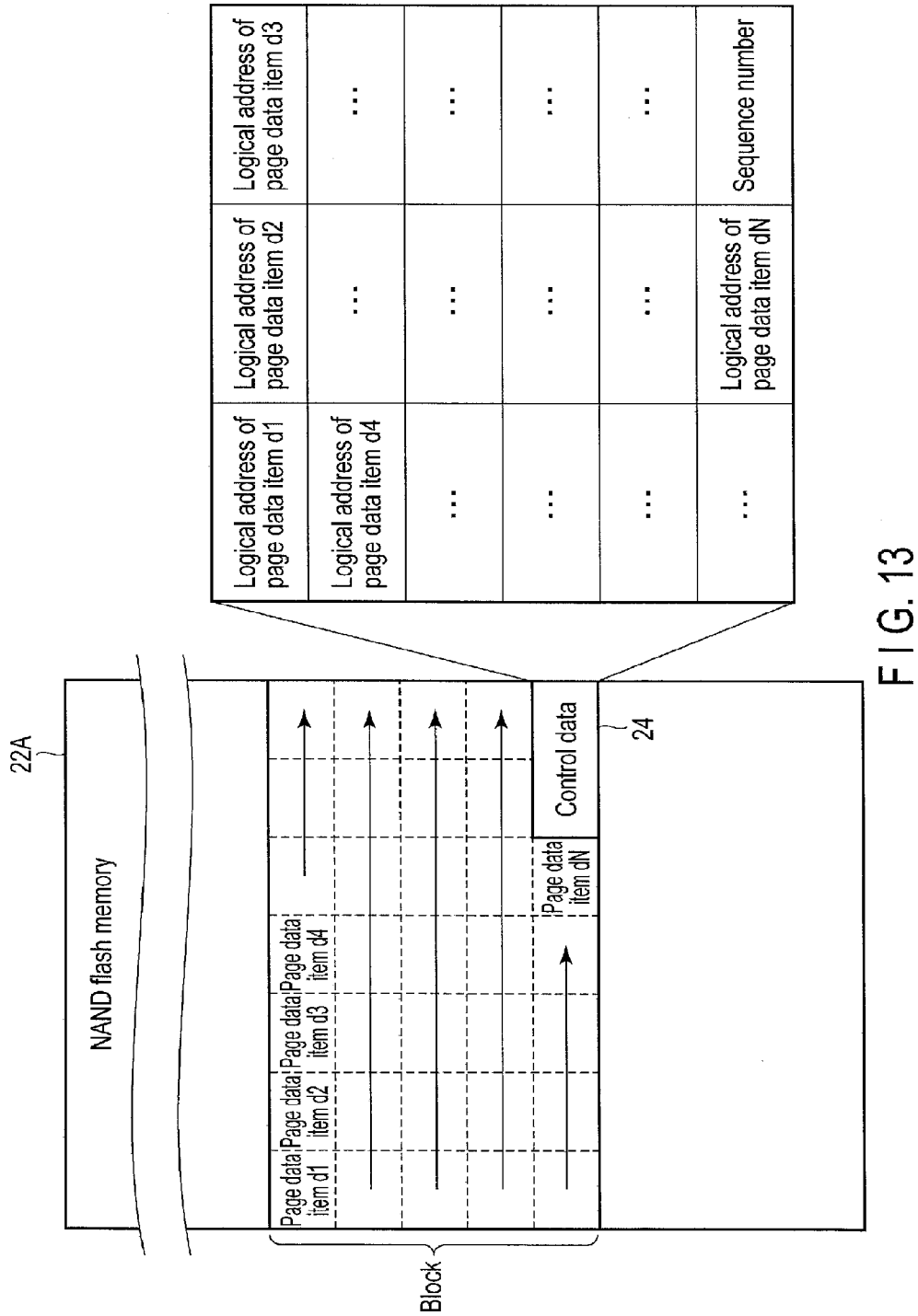
F I G. 13

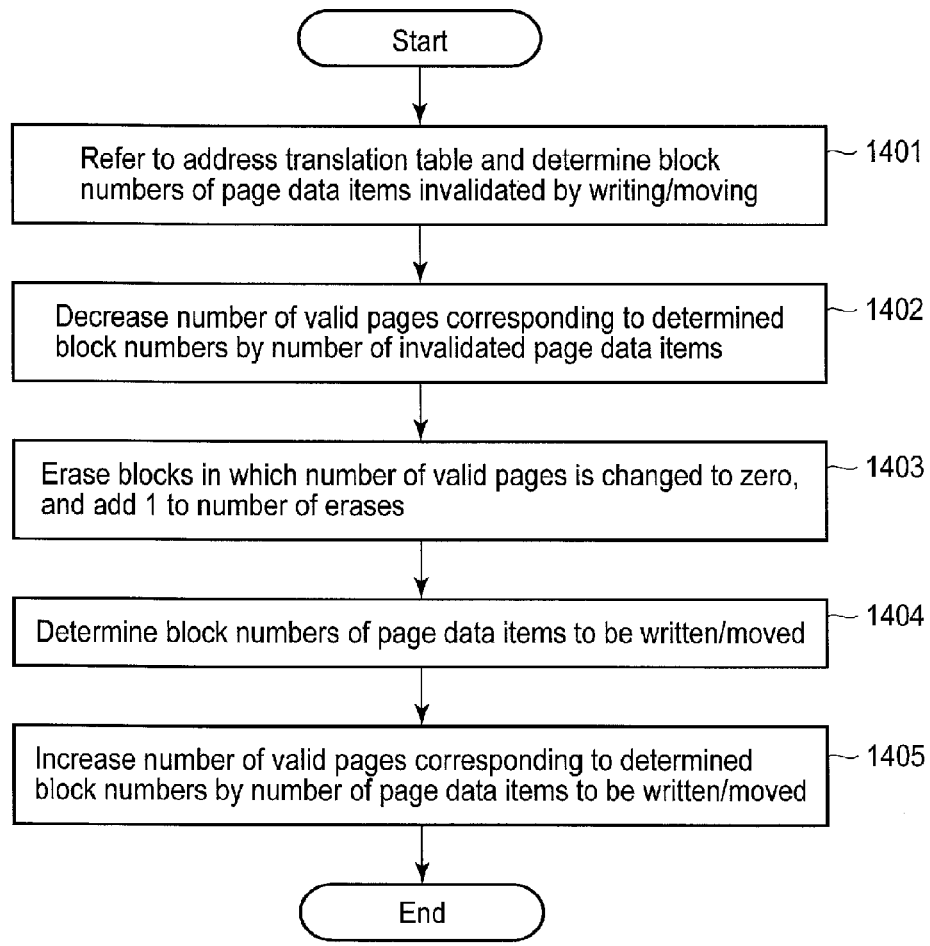
F I G. 14

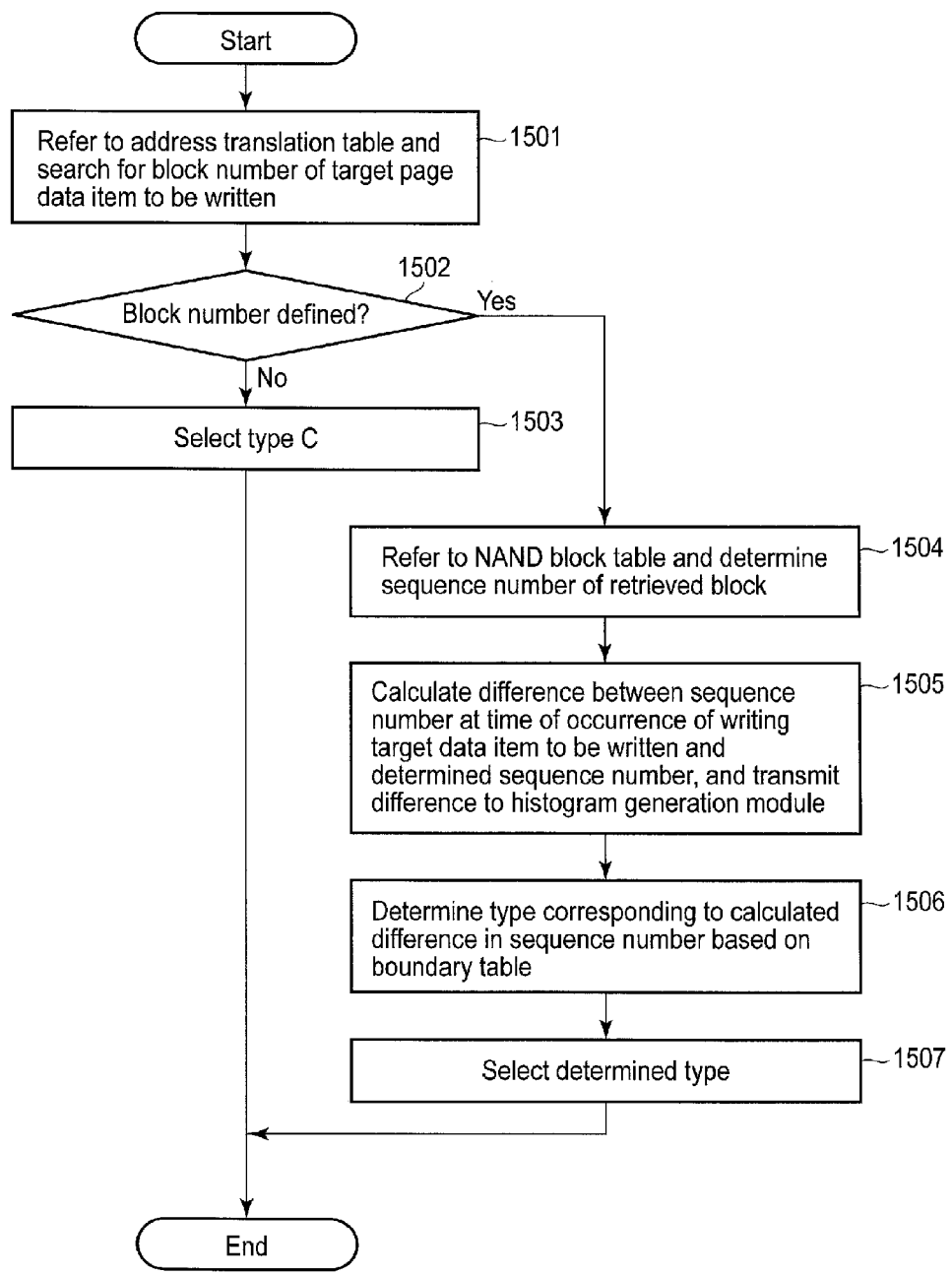
F I G. 15

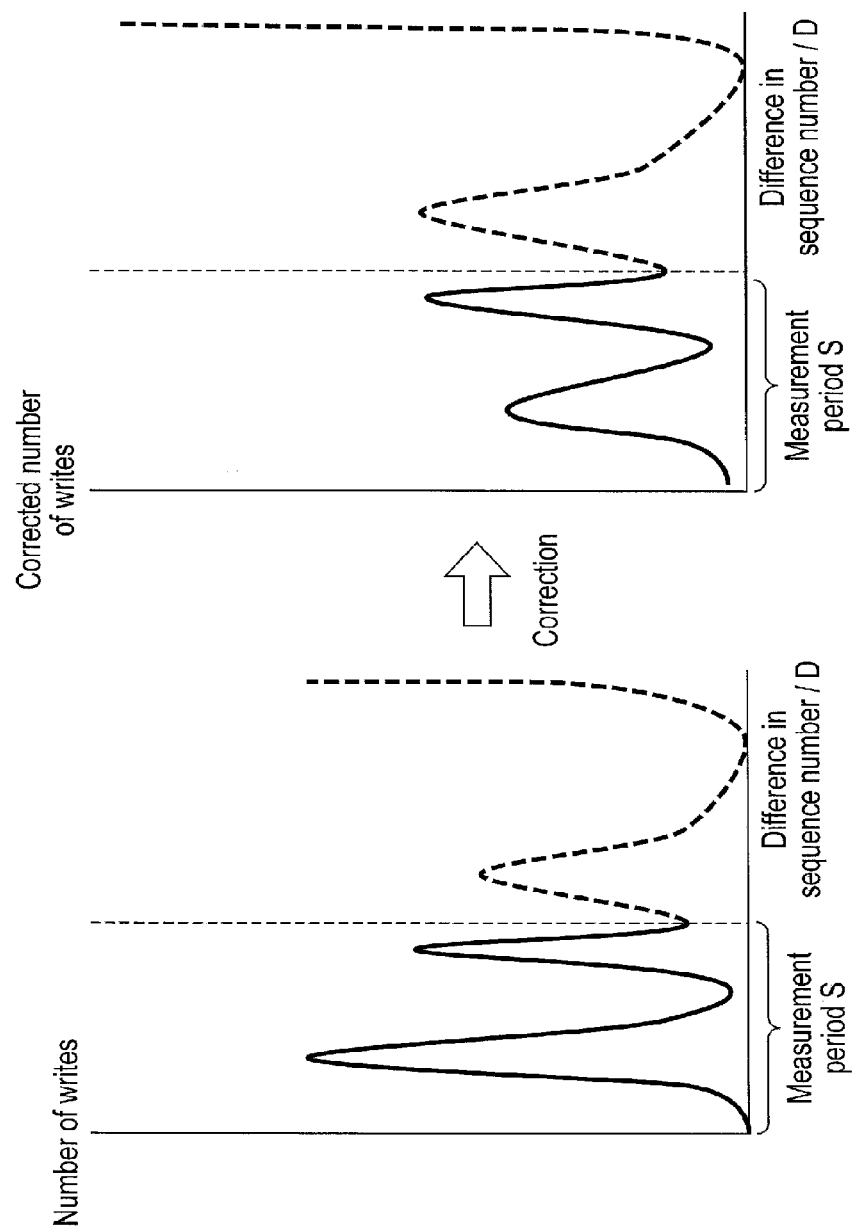
F I G. 17

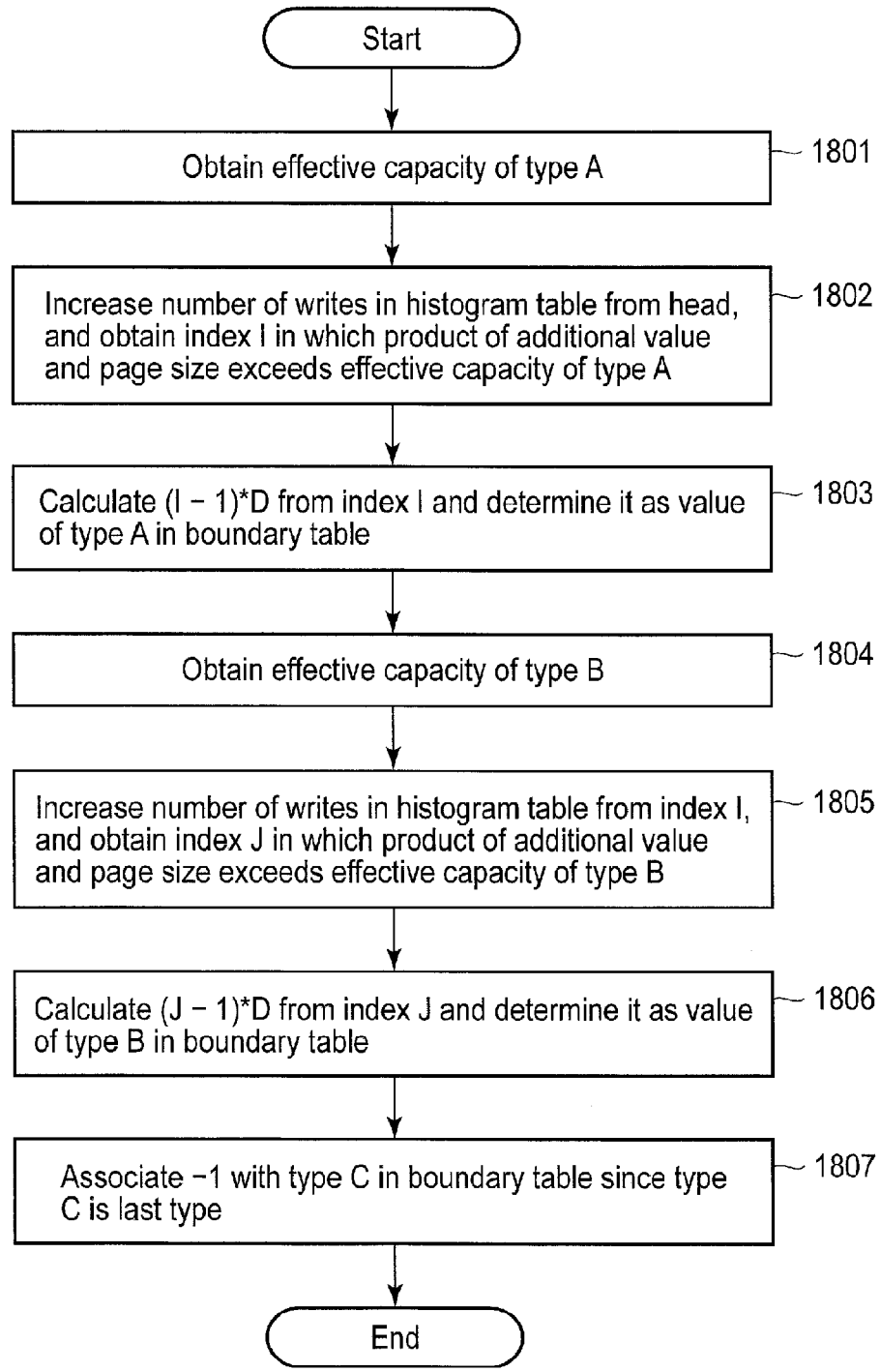
F I G. 18

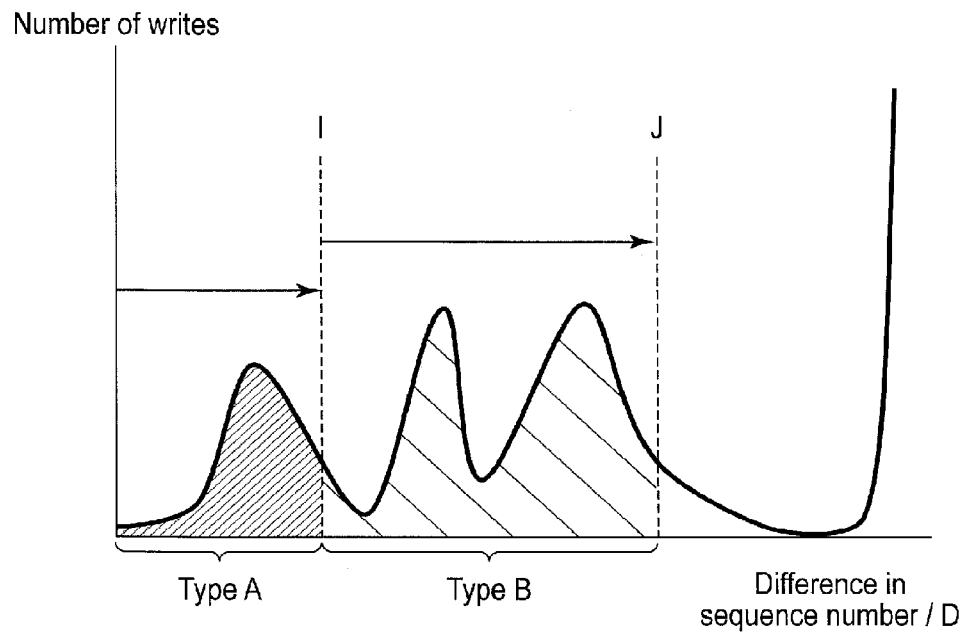
F I G. 19
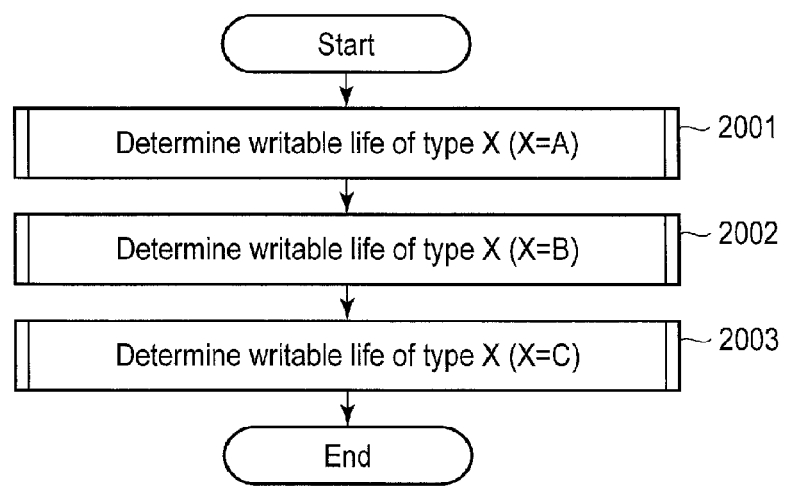
F I G. 20

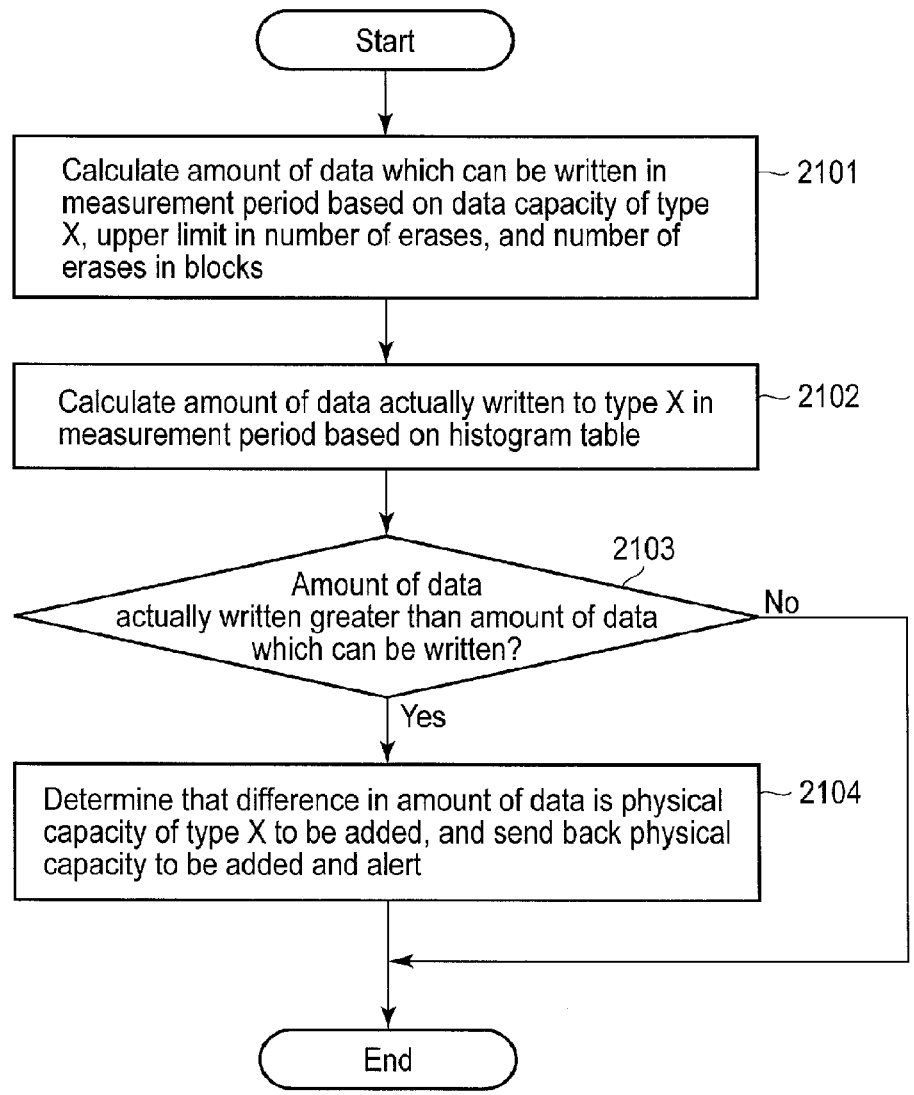
F I G. 21

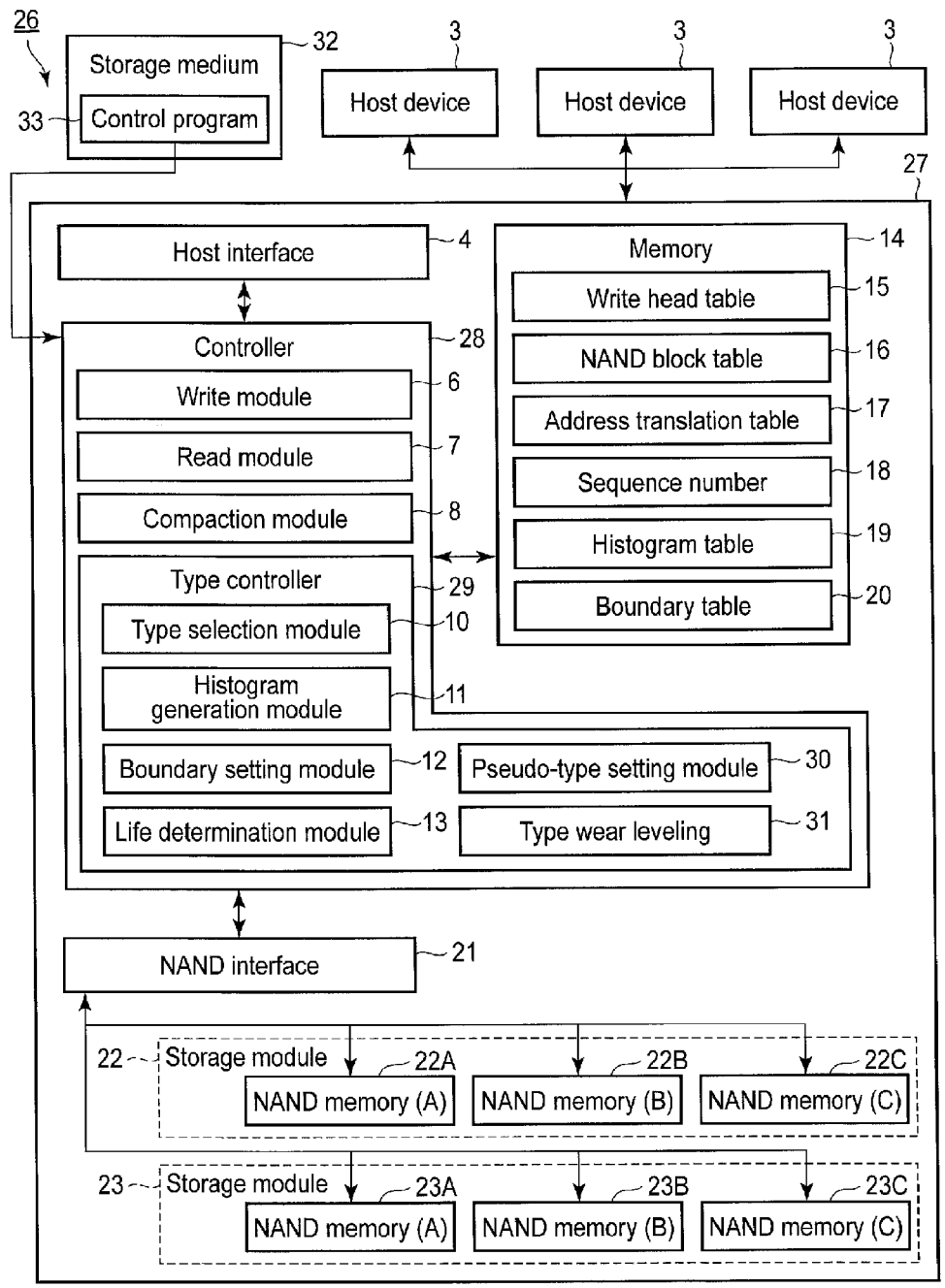
F I G. 22

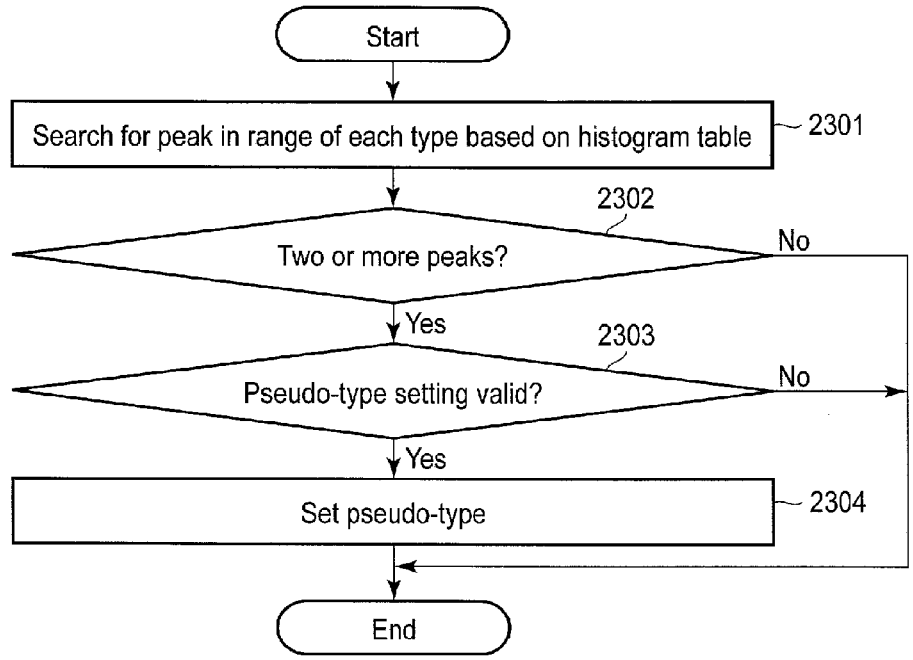
F I G. 23
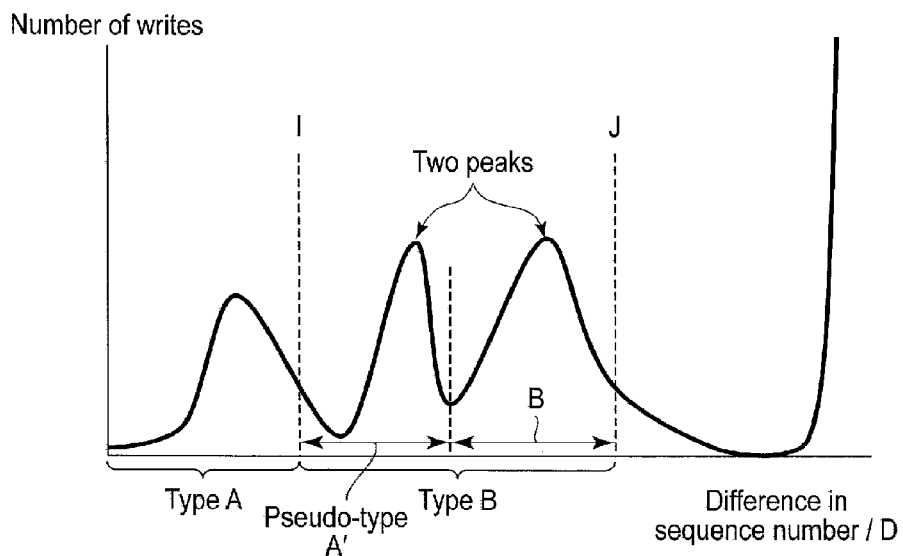
F I G. 24

| NAND block table |||||| 
|---|---|---|---|---|---|
| Block number | Number of valid pages | Sequence number | Number of erases | Type | Upper limit in number of erases |
| 0 | 56 | 876 | 1233 | A | 10000 |
| 1 | 65 | 1234 | 452 | A | 10000 |
| ⋮ | ⋮ | ⋮ | ⋮ | A | 10000 |
| 999999 | 0 | -1 | 982 | A | 10000 |
| 1000000 | 18 | 99880 | 232 | A' | 3000 |
| ⋮ | ⋮ | ⋮ | ⋮ | A' | 3000 |
| 1999999 | 0 | -1 | 100 | A' | 3000 |
| 2000000 | 0 | -1 | 41 | B | 3000 |
| ⋮ | ⋮ | ⋮ | ⋮ | B | 3000 |
| 2999999 | 0 | -1 | 30 | B | 3000 |
| 3000000 | 32 | 9876544 | 10 | C | 300 |
| ⋮ | ⋮ | ⋮ | ⋮ | C | 300 |
| 9999999 | 0 | -1 | 2 | C | 300 |

F I G. 25

| Boundary table | |
|---|---|
| Type | Boundary value |
| A | 2000000 |
| A' | 4000000 |
| B | 6000000 |
| C | -1 |

FIG. 26

| Write head table | | |
|---|---|---|
| Type | Block number | Page number |
| A | 123 | 22 |
| A' | 1000000 | 0 |
| B | 2056889 | 2 |
| C | 6743447 | 120 |

FIG. 27

STORAGE DEVICE, METHOD, AND COMPUTER-READABLE MEDIUM FOR SELECTING A WRITE DESTINATION OF TARGET DATA TO NONVOLATILE MEMORIES HAVING DIFFERENT ERASE LIMITS BASED UPON A WRITE INTERVAL

CROSS REFERENCE TO RELATED APPLICATIONS

This application is a Continuation Application of PCT Application No. PCT/JP2014/082137, filed Dec. 4, 2014, the entire contents of which are incorporated herein by reference.

FIELD

Embodiments described herein relate generally to a storage device including nonvolatile semiconductor memories with different characteristics, a method for controlling a storage device, and a computer-readable nonvolatile storage medium for storing a program.

BACKGROUND

An example of nonvolatile semiconductor memories is an NAND flash memory. The NAND flash memory has different types such as a single-level cell (SLC), a multi-level cell (MLC) and an enterprise MLC (eMLC). Different types of NAND flash memories have different characteristics. For example, the upper limit in the number of erases differs depending on the type of NAND flash memory.

BRIEF DESCRIPTION OF THE DRAWINGS

FIG. 1 is a block diagram exemplarily showing a configuration of a computer system including a storage device according to a first embodiment.

FIG. 2 is a data structural diagram showing an example of a write head table.

FIG. 3 is a data structural diagram showing an example of a NAND block table.

FIG. 4 is a data structural diagram showing an example of an address translation table.

FIG. 5 is a data structural diagram showing an example of a histogram table.

FIG. 6 is a data structural diagram showing an example of a boundary table.

FIG. 13 is a data structural diagram showing an example of control data.

FIG. 14 is a flowchart showing an example of a process for updating the NAND block table.

FIG. 15 is a flowchart showing an example of a process for selecting a type.

FIG. 17 is a graph showing an example of correction of the histogram table.

FIG. 18 is a flowchart showing an example of a process for setting a boundary.

FIG. 19 is a graph showing a relationship between a histogram and indexes I and J.

FIG. 20 is a flowchart showing an example of a process for determining a writable life of each of types.

FIG. 21 is a flowchart showing an example of a process for determining the writable life of a specific type.

FIG. 22 is a block diagram showing an example of a configuration of a computer system including a storage device of a second embodiment.

FIG. 23 is a flowchart showing an example of a process for setting a pseudo-type.

FIG. 24 is a graph showing an example of the pseudo-type.

FIG. 25 is a data structural diagram showing an example of the NAND block table in which the pseudo-type is set.

FIG. 26 is a data structural diagram showing an example of the boundary table in which the pseudo-type is set.

FIG. 27 is a data structural diagram showing an example of the write head table in which a pseudo-type is set.

DETAILED DESCRIPTION

Figure 7:
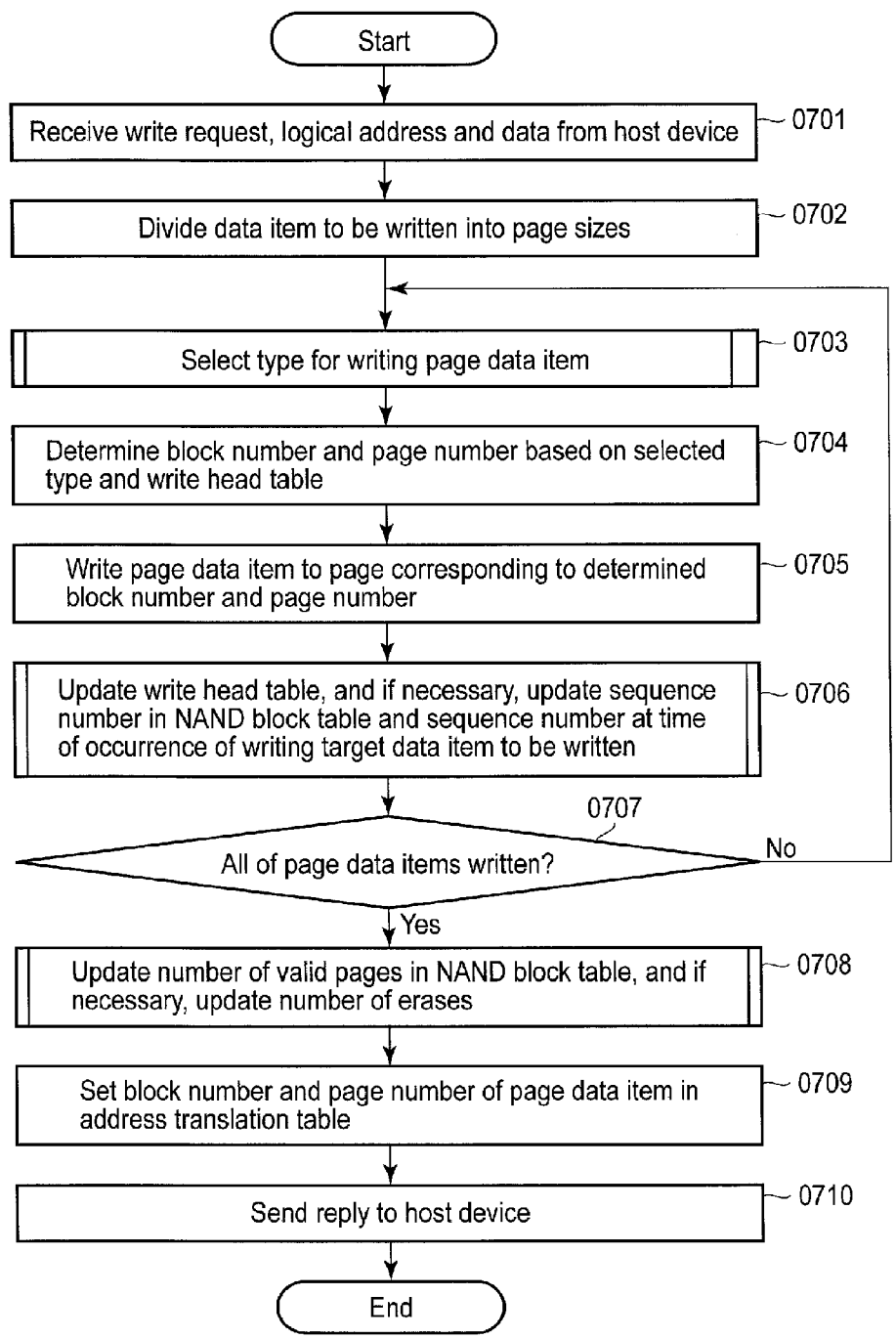
FIG. 7 is a flowchart showing an example of a process for additional writing.

Embodiments described herein provide a storage device which extends the life of nonvolatile semiconductor memories with different characteristics, a method for controlling a storage device, and a computer-readable nonvolatile storage medium for storing a program.

In general, according to one embodiment, a storage device includes a storage module, a management storage module, a selection module, and a write module. The storage module includes a plurality of areas having different upper limits in the number of erases. The management storage module stores first management data in which a sequence number indicating an order of write-completion is associated with each erase unit area included in the plurality of areas, second management data indicating a relationship between each write interval and each write destination area, and address translation data in which a logical address is associated with the erase unit area. The selection module, when target data to be written is written to the storage module, obtains the erase unit area corresponding to the logical address of the target data to be written based on the address translation data, calculates a write interval of the target data to be written from a difference between the sequence number at a time of occurrence of writing the target data to be written and the sequence number corresponding to the erase unit area of the first management data based on the first management data, and selects the write destination area corresponding to the write interval of the target data to be written based on the second management data. The write module writes the target data to be written to the write destination area selected by the selection module, and changes the sequence number when writing is completed for one erase unit area.

Embodiments of the present invention will be described below with reference to the accompanying drawings. In the following description, structural elements and functions which are nearly or substantially the same as each other are denoted by the same reference numbers, and detailed descriptions are omitted unless necessary.

In the embodiments, it is assumed that a plurality of nonvolatile memories are different types. However, the embodiments may be applied even when a plurality of nonvolatile memories are the same type and have different characteristics. In other words, the embodiments may be applied when areas which have different upper limits in the number of erases are generated in one or more nonvolatile memories. In each area, the greater the upper limit in the number of erases is, the longer the rewritable life is.

In the embodiments, the types of nonvolatile memories are, for example, as described above, an SLC, an MLC and eMLC.

In the embodiments, nonvolatile memories which have different upper limits in the number of erases are explained as nonvolatile memories with different characteristics. However, the characteristics of nonvolatile memories may refer to, for example, high endurance or read intensive.

In the embodiments, nonvolatile memories which are different types and have the same characteristics may be dealt with as the same type.

The storage device of each embodiment manages a sequence number indicating the order of write-completion (or update-completion) for each erase unit area of a nonvolatile memory, using less data. The storage device calculates a write interval based on a sequence number at the time of occurrence of writing target data, and a sequence number at the time of write-completion for an erase unit area including the target data. The storage device selects the write destination area of the target data from different types of nonvolatile memories based on the write interval.

To select the type of nonvolatile memory corresponding to the write interval, the storage device of each embodiment generates a histogram indicating the number of writes corresponding to each write interval, sets a threshold (boundary value) for selecting the type based on the generated histogram, and determines whether the write interval exceeds the threshold.

In the embodiments, it is assumed that a sequence number is managed for each erase unit area of a nonvolatile memory. However, a sequence number may not be managed for each erase unit area, and may be managed for a different area size such as the assembly of two or more write unit areas or the assembly of two or more erase unit areas.

In the embodiments, the types of erase unit areas of nonvolatile memories are managed. The upper limit in the number of erases is managed for each type of erase unit areas of nonvolatile memories. Further, the number of erases is managed for each erase unit area of nonvolatile memories.

In the embodiments, a sequence number is a consecutive number which is increased (such that an integer type of variable is increased by one) every time writing has been completed for one erase unit area in a nonvolatile memory.

In the embodiments, as a write interval, the difference in sequence number as defined below is used. Specifically, this difference is the difference between a sequence number at the time of occurrence of writing target data and a sequence number corresponding to the erase unit area in which target data is previously written. In the embodiments, a sequence number at the time of occurrence of writing target data is, for example, the latest sequence number, which is changed every time writing has been completed for an erase unit area.

In the embodiments, each nonvolatile memory is assumed to be a nonvolatile semiconductor memory such as an NAND flash memory. However, each nonvolatile memory may be a memory such as an NOR flash memory, a magnetoresistive random access memory (MRAM), a phase change random access memory (PRAM), a resistive random access memory (ReRAM) or a ferroelectric random access memory (FeRAM).

In each NAND flash memory, a write unit area is called a page, and an erase unit area is called a block. Each block includes a plurality of pages.

First Embodiment

FIG. 1 is a block diagram exemplarily showing the configuration of a computer system including a storage device according to a first embodiment.

A computer system 1 includes a storage device 2 including NAND flash memories 22A to 22C and 23A to 23C in different types A to C, and one or more host devices 3 which access the storage device 2.

The storage device 2 includes a host interface 4, a controller 5, a memory 14, a NAND interface 21 and storage modules 22 and 23.

Storage module 22 includes NAND flash memories 22A to 22C in different types A to C.

Storage module 23 includes NAND flash memories 23A to 23C in different types A to C.

The storage device 2 is a dual-redundant device realized by storage modules 22 and 23. Specifically, the same data is written to NAND flash memory 22A of storage module 22 and NAND flash memory 23A of storage module 23. The same data is written to NAND flash memory 22B and NAND flash memory 23B. The same data is written to NAND flash memory 22C and NAND flash memory 23C. Thus, even if one of storage modules 22 and 23 goes wrong, the storage device 2 can be operated normally.

NAND flash memories 22A and 23A are assumed to be type A in which the upper limit in the number of erases is great (in other words, the resistance to writing is high). For example, type A is an SLC.

NAND flash memories 22B and 23B are assumed to be type B in which the upper limit in the number of erases is intermediate (in other words, the resistance to writing is intermediate). For example, type B is an eMLC.

NAND flash memories 22C and 23C are assumed to be type C in which the upper limit in the number of erases is less (in other words, the resistance to writing is low). For example, type C is an MLC.

In the present embodiment, it is assumed that the storage device 2 includes three types of NAND flash memories 22A to 22C and 23A to 23C. However, the storage device 2 may include one, two, four or more types of NAND flash memories.

In the present embodiment, storage module 22 includes one or more NAND flash memories in each of types A to C. Storage module 23 includes one or more NAND flash memories in each of types A to C. The number of NAND flash memories in each of types A to C may differ depending on the type.

The memory 14 is a nonvolatile memory. The memory 14 stores a write head table 15, a NAND block table 16, an address translation table 17, a sequence number 18, a histogram table 19 and a boundary table 20.

The write head table 15 manages the head block and head page to which data is written by additional writing for each of types A to C.

The NAND block table 16 manages the information of each block of NAND flash memories 22A to 22C and 23A to 23C. For example, the NAND block table 16 stores the sequence number of each block of NAND flash memories 22A to 22C and 23A to 23C. When a plurality of write-completions have been applied to the same block, the NAND block table 16 stores the maximum sequence number in the block, in other words, the sequence number at the time of the latest write-completion in the block.

The address translation table 17 is the information for translating the logical address of each host device 3 into the physical address indicating the position to which data is actually written in NAND flash memories 22A to 22C and 23A to 23C.

In the present embodiment, for example, the logical address of each host device 3 is allocated for each sector (for example, 512 bytes). The logical address of page data is allocated for each page of NAND flash memories (for example, 4096 bytes). For example, the logical address of page data can be obtained by dividing the logical address of each host device 3 by 8 (=4096/512).

The sequence number 18 is increased every time writing has been completed for one block in NAND flash memories 22A to 22C and 23A to 23C. The sequence number 18 is the greatest and latest sequence number.

For example, when a sequence number corresponding to a block is less, the writing of data included in the block is old. When a sequence number corresponding to a block is great, the writing of data included in the block is new. The difference in sequence number between the sequence number 18 at the time of occurrence of writing target data and the sequence number at the time of write-completion for the block to which target data has been written indicates a write interval.

When the difference in sequence number is large, the write interval is determined as a long interval. When the difference in sequence number is small, the write interval is determined as a short interval.

The histogram table 19 shows a histogram indicating the relationship between the difference in sequence number and the number of writes, allocating the difference in sequence number to bins, and the number of writes (the number of samples) indicating the number of occurrences of writes for page unit corresponding to the difference in sequence number to frequencies.

The boundary table 20 includes a boundary value used to select a type based on the difference in sequence number between the sequence number 18 and a sequence number corresponding to the block to which target data has been written.

The controller 5 includes a write module 6, a read module 7, a compaction module 8, and a type controller 9. Each function of the controller 5 may be realized when a computer reads and executes a control program 33 stored in a computer-readable nonvolatile storage medium 32.

The write module 6 receives a write request, target data to be written and a logical address from the host device 3 via the host interface 4. The write module 6 writes the target data by additional writing via the NAND interface 21 to one of NAND flash memories 22A to 22C and 23A to 23C selected by a type selection module 10. More specifically, the write module 6 divides the write data from the host device 3 into page data items, receives the information regarding the type of write destination of each page data item from the type selection module 10, and writes each page data item to the selected type of NAND flash memory by additional writing.

After the writing, the write module 6 updates the number of valid blocks in the NAND block table 16 only by the increase caused by writing and the decrease caused by oldness, updates the address translation table 17 to the address of the nonvolatile memory to which data is written, and updates the write head table 15 so as to indicate a new free space. The write module 6 sends a reply to the host device 3. Further, the write module 6 associates the block number in which writing has been completed with the sequence number 18 in the NAND block table 16 every time writing has been completed for one block. Thus, the write module 6 adds 1 to the sequence number 18.

The read module 7 receives a read request and the information of a logical address from the host device 3 via the host interface 4, translates the logical address into a physical address based on the address translation table 17, and reads data indicated by the physical address in NAND flash memories 22A to 22C and 23A to 23C via the NAND interface 21. The read module 7 sends the read data to the host device 3 via the host interface 4.

In the present embodiment, data is exchanged between the host device 3 and the storage device 2 via the host interface 4. In the storage device 2, data is exchanged between the controller 5 and NAND flash memories 22A to 22C and 23A to 23C via the NAND interface 21.

The compaction module 8 generates a free space for a plurality of blocks altogether when NAND flash memories 22A to 22C and 23A to 23C have no space for data by additional writing.

The type controller 9 controls the selection of a type for additional writing. The type controller 9 includes the type selection module 10, a histogram generation module 11, a boundary setting module 12 and a life determination module 13.

The type selection module 10 selects a type to write data by additional writing based on the determination regarding whether the difference in sequence number calculated at the time of writing target data exceeds the boundary value of the boundary table 20. More specifically, first, the type selection module 10 obtains a block to which target data corresponding to a logical address has been written, based on the address translation table 17. Subsequently, the type selection module 10 obtains the sequence number at the time of write-completion for the obtained block based on the NAND block table 16. The type selection module 10 obtains the difference in sequence number between the sequence number at the time of write-completion for the block and the sequence number 18. As the write destination, the type selection module 10 selects a block in which the number of erasable times is greater with a smaller difference in sequence number, and selects a block in which the number of erasable times is less with a larger difference in sequence number, based on the boundary table 20.

The histogram generation module 11 generates the histogram table 19 necessary to generate the boundary table 20. For example, the histogram generation module 11 accumulates the number of writes for page unit relative to each of the ranges into which the calculated differences in sequence number are categorized. The histogram generation module 11 generates the histogram table 19 having the ranges of differences in sequence number as bins and the number of writes as the frequency. The histogram generation module 11 updates the histogram table 19 at the time of writing from the host device 3.

The boundary setting module 12 calculates a boundary value used to select each of types A to C based on the histogram table 19 generated by the histogram generation module 11, and sets the boundary value in the boundary table 20. For example, the boundary setting module 12 obtains a boundary value for the difference in sequence number based on the histogram table 19 such that the amount of data written to types A and B of NAND flash memories 22A to 22C and 23A to 23C is equivalent to the effective capacity of types A and B. The boundary setting module 12 sets the boundary value in the boundary table 20.

The life determination module 13 calculates the actual amount of writing for NAND flash memories 22A to 22C and 23A to 23C based on the histogram table 19 stored in the memory 14, and determines the writable life of NAND flash memories 22A to 22C and 23A to 23C. In the present embodiment, the life is a period in which each memory can be used. As a specific example, the life determination module 13 calculates the amount of data which can be written to types A to C in a measurement period, based on the data capacity of types A to C, the upper limit in the number of erases in types A to C, and the number of erases of each block. The life determination module 13 calculates the amount of data which has been written to types A to C in the measurement period, based on the histogram table 19. The life determination module 13 outputs an alert to types A to C when the amount of data which has been written in the measurement period is greater than the amount of data which can be written in the measurement period.

FIG. 2 is a data structural diagram showing an example of the write head table 15.

The write head table 15 includes a head block number and a head page number to which data is written by additional writing for each of types A to C. When the write head table 15 is used, and a type is selected, it is possible to determine the block and page which should be the destination of the next additional write.

FIG. 3 is a data structural diagram showing an example of the NAND block table 16.

The NAND block table 16 associates a block number (block address), the number of valid pages of a corresponding block (the number of page data items written to a block in a valid state), a sequence number, the number of erases, a type, and the upper limit in the number of erases with each other. A block number is allocated to each storage area of a block size. A page data item is the data item of a page size. A value of −1 is set to the sequence number of a block to which a page data item is not written. The information of all of the blocks of NAND flash memories 22A to 22C and 23A to 23C enters the NAND block table 16.

Handling examples are as follows. As a first example, the number of valid pages in the NAND block table 16 is updated when a page data item is written to the block indicated by a block number. As a second example, the sequence number is updated every time writing has been completed for the block indicated by a block number. As a third example, the number of erases is updated for every erase for the block indicated by a block number. Further, for example, the type and the upper limit in the number of erases are set in advance in accordance with the characteristics of NAND flash memories 22A to 22C and 23A to 23C.

FIG. 4 is a data structural diagram showing an example of the address translation table 17.

The address translation table 17 associates the logical address of each page data item, a corresponding block number and a corresponding page number with each other. An entry in the address translation table 17 of FIG. 4 is based on a page size. A block number and a page number correspond to a physical address. The logical address of a page data item is translated into the block number and the page number of the write or read destination in NAND flash memories 22A to 22C and 23A to 23C, using the address translation table 17.

FIG. 5 is a data structural diagram showing an example of the histogram table 19.

The histogram table 19 associates each difference in sequence number with the number of writes (the number of samples) corresponding to the difference in sequence number. When the differences in sequence number are used as they are for the bins of the histogram, the number of writes for each difference in sequence number is less. Thus, the feature of the histogram is difficult to exhibit. Therefore, as the bins of the histogram, the differences in sequence number are categorized into appropriate ranges. The number of writes is accumulated for each of the ranges of the differences in sequence number. Each range of the difference in sequence number is shown as the "difference in sequence number/D". The "difference in sequence number/D" can be appropriately changed based on the feature and the use application of the storage device 2.

The maximum value of the "difference in sequence number/D" in the histogram table 19 is set based on the number of blocks included in NAND flash memories 22A and 23A in type A and NAND flash memories 22B and 23B in type B.

FIG. 6 is a data structural diagram showing an example of the boundary table 20.

The boundary table 20 includes each boundary value of the difference in sequence number to select types A to C. The type for writing target data is selected based on the boundary values set in the boundary table 20. In FIG. 6, the upper limits of types A and B are set as the boundary values of types A and B. A value of −1 corresponding to type C shows that no upper limit is set. According to this table, when the calculated difference in sequence number for target data to be written is 0 to 2000000, type A is selected. When the difference in sequence number is 2000001 to 6000000, the block of type B is selected. When the difference in sequence number is greater than or equal to 6000001, the block of type C is selected.

Now, each process of the storage device 2 of the present embodiment is explained.

FIG. 7 is a flowchart showing an example of a process for additional writing by the storage device 2 according to the first embodiment.

In step 0701, the write module 6 receives a write request, a logical address and target data to be written from the host device 3.

In step 0702, the write module 6 divides the target data to be written into page data items.

In step 0703, the type selection module 10 selects a type to write each page data item.

In step 0704, the write module 6 determines the block number and the page number of the NAND flash memory to write each page data item based on the type selected by the type selection module 10 and the write head table 15 stored in the memory 14.

In step 0705, the write module 6 writes each page data item to a page corresponding to the determined block number and page number by additional writing.

In step 0706, the write module 6 updates a write head block number and page number corresponding to the selected type in the write head table 15. When writing has been completed for one block, the write module 6 updates a sequence number corresponding to the determined block number in the NAND block table 16, and adds 1 to the sequence number 18.

In step 0707, the write module 6 determines whether writing has been completed for all of the page data items. When writing has not been completed for all of the page data items, the process returns to step 0703. When writing has been completed for all of the page data items, the process proceeds to step 0708.

In step 0708, the write module 6 updates the number of valid pages corresponding to the block number indicating the block to which each page data item is written in the NAND block table 16. When erasing has been performed at the time of writing, the write module 6 updates the number of erases.

In step 0709, the write module 6 sets the logical address of each page data item, and the block number and page number of the write destination, in the address translation table 17.

In step 0710, the write module 6 sends a reply to the host device 3.

In the process of FIG. 7, the order to update the write head table 15, the NAND block table 16 and the address translation table 17 may be arbitrarily changed. Alternatively, these update steps may be performed concurrently.

Figure 8:
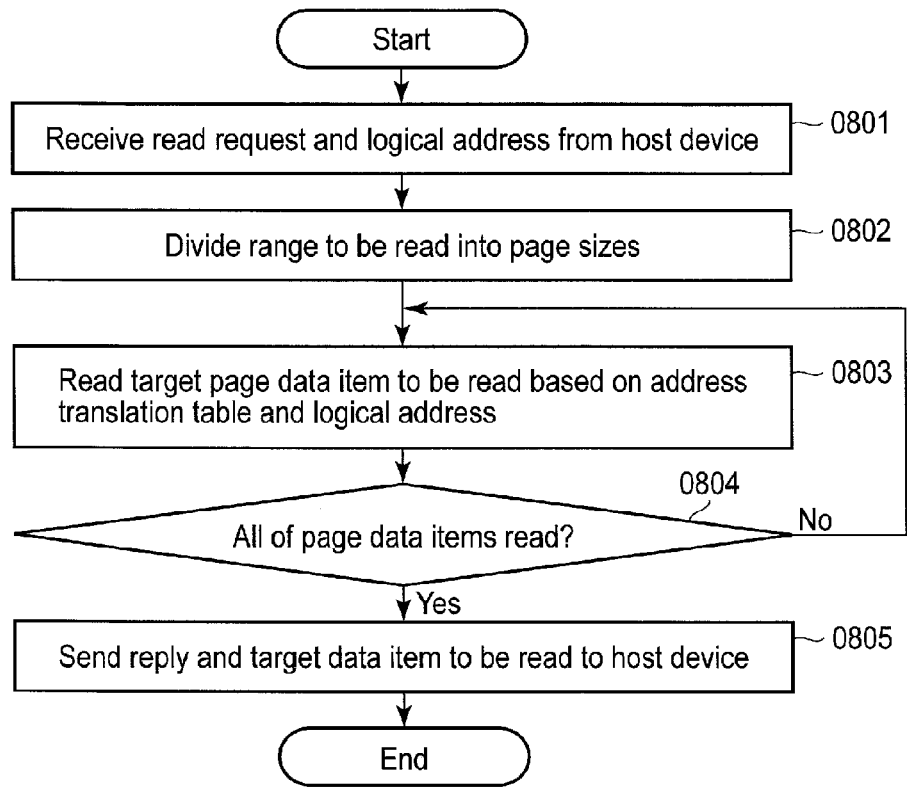
FIG. 8 is a flowchart showing an example of a process for reading.

FIG. 8 is a flowchart showing an example of a process for reading by the read module 7.

In step 0801, the read module 7 receives a read request and a logical address from the host device 3.

In step 0802, the read module 7 divides the target (range) to be read into page sizes based on the read request.

In step 0803, the read module 7 reads the target page data item from a block number and a page number corresponding to the logical address based on the address translation table 17 stored in the memory 14 and the logical address.

In step 0804, the read module 7 determines whether all of the target page data items have been read. When all of the page data items have not been read, the process returns to step 0803. When all of the page data items have been read, the process proceeds to step 0805.

In step 0805, the read module 7 sends a reply and the target data items to be read to the host device 3.

Figure 9:
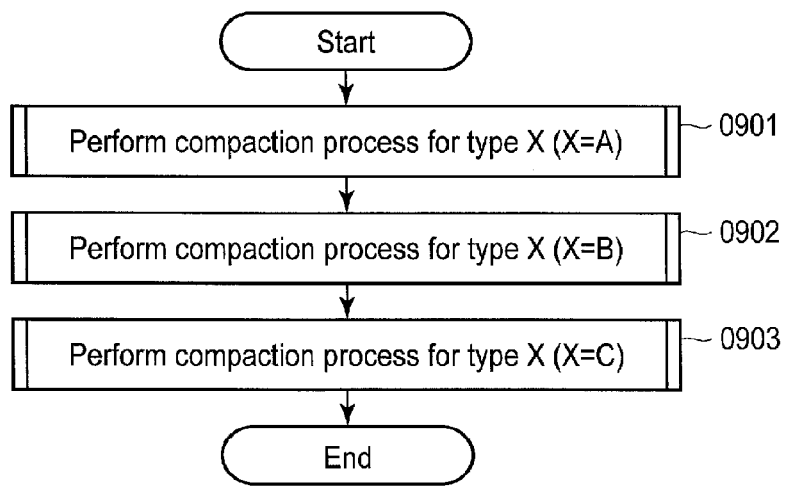
FIG. 9 is a flowchart showing an example of a compaction process.

FIG. 9 is a flowchart showing an example of a compaction process by the compaction module 8. In the following explanation, the target type for compaction is indicated as X. Type X is equivalent to one of types A to C.

In step 0901, for example, the compaction module 8 performs a compaction process for NAND flash memories 22A and 23A in type A.

In step 0902, for example, the compaction module 8 performs a compaction process for NAND flash memories 22B and 23B in type B.

In step 0903, for example, the compaction module 8 performs a compaction process for NAND flash memories 22C and 23C in type C.

In the process of FIG. 9, the order to perform a compaction process corresponding to each of types A to C may be arbitrarily changed.

In this way, a compaction process is performed for each of types A to C.

Figure 10:
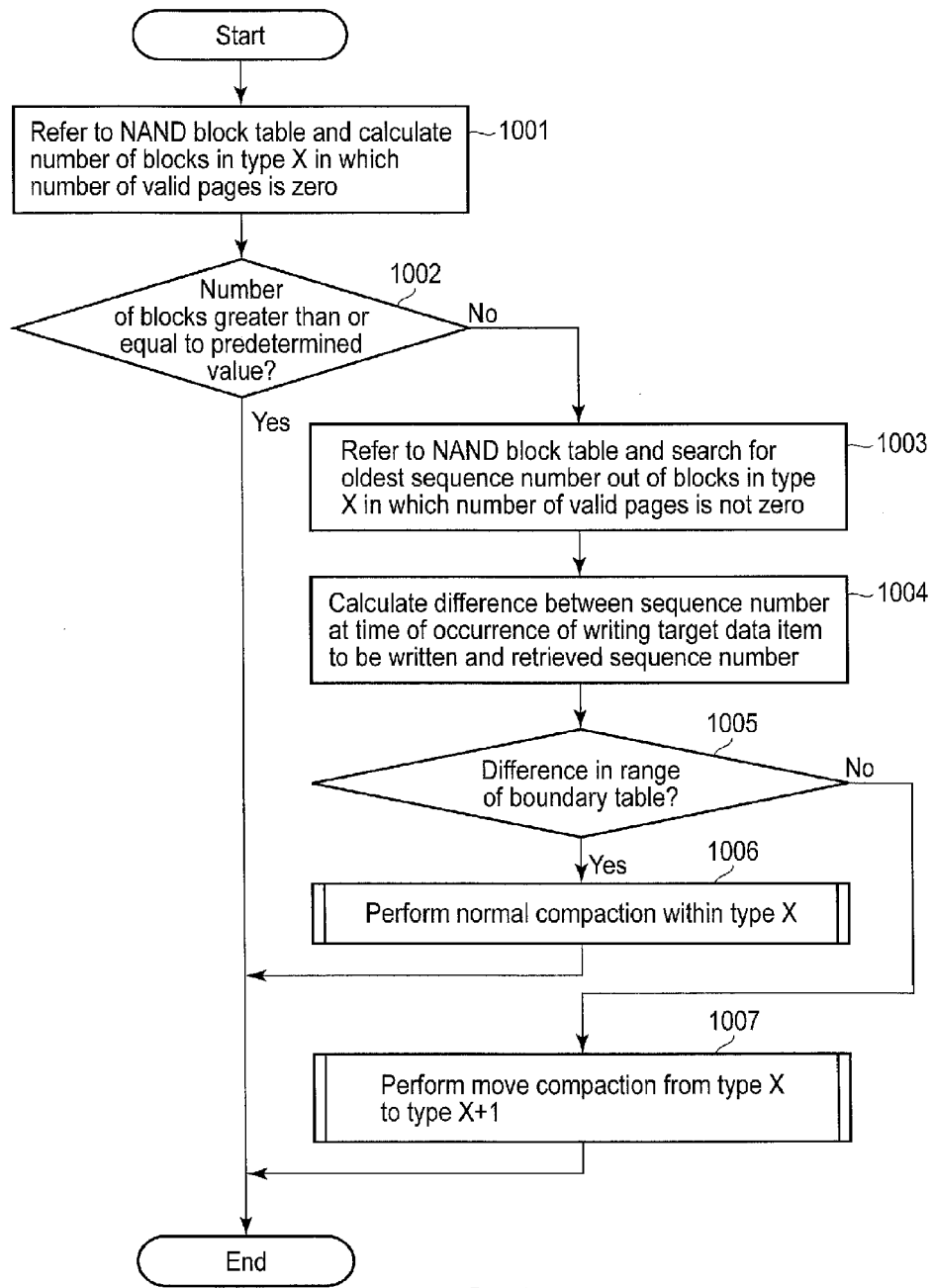
FIG. 10 is a flowchart showing a specific example of the compaction process.

FIG. 10 is a flowchart showing a specific example of a compaction process. In the process of FIG. 10, type X+1 is the type of block of the move destination when a page data item written to the block of type X is moved.

In step 1001, the compaction module 8 refers to the NAND block table 16, and calculates the number of blocks in type X in which the number of valid pages is zero.

In step 1002, the compaction module 8 determines whether the calculated number of blocks is greater than or equal to a predetermined value. When the calculated number of blocks is greater than or equal to the predetermined value, the process is terminated. When the calculated number of blocks is less than the predetermined value, the process proceeds to step 1003.

In step 1003, the compaction module 8 refers to the NAND block table 16, and searches for the oldest sequence number out of the blocks in type X in which the number of valid pages is not zero.

In step 1004, the compaction module 8 calculates the difference in sequence number between the sequence number 18 and the retrieved oldest sequence number.

In step 1005, the compaction module 8 determines whether the calculated difference in sequence number is included in a range corresponding to type X in the boundary table 20. When the difference in sequence number is included in a range corresponding to type X in the boundary table 20, the process proceeds to step 1006. When the difference in sequence number is not included in a range corresponding to type X in the boundary table 20, the process proceeds to step 1007.

In step 1006, the compaction module 8 performs normal compaction within type X.

In step 1007, the compaction module 8 performs move compaction for switching the type of write destination from type X to type X+1.

Figure 11:
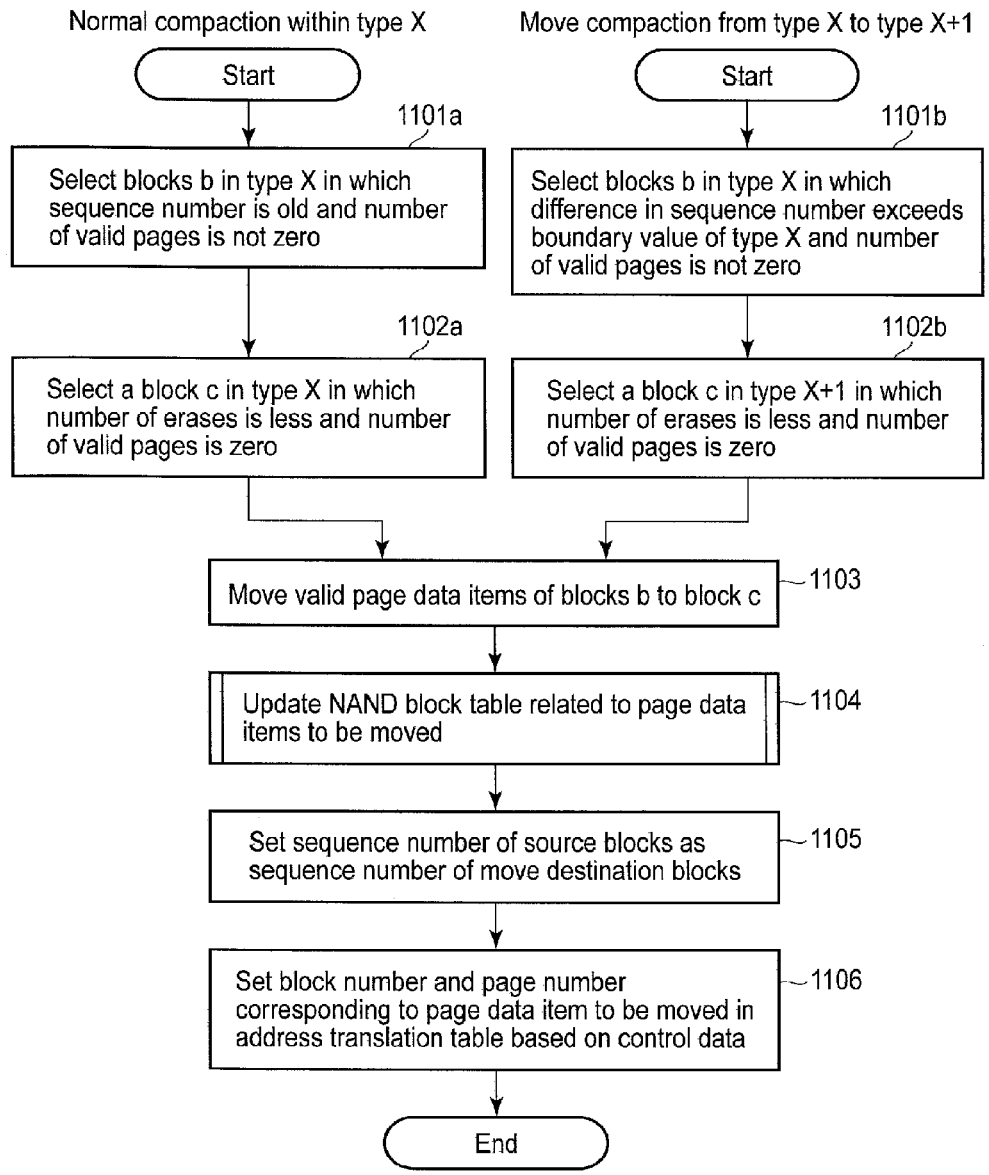
FIG. 11 is a flowchart showing an example of normal compaction and move compaction.

FIG. 11 is a flowchart showing an example of normal compaction (step 1006 in FIG. 10) and move compaction (step 1007 in FIG. 10).

First, normal compaction is explained.

In step 1101a, the compaction module 8 refers to the NAND block table 16, and selects a plurality of blocks b in type X in which the number of valid pages is not zero and the sequence number is old. As a method for selecting a plurality of blocks b in which the sequence number is old, for example, a predetermined number of blocks may be selected in the ascending order of the sequence number. Alternatively, arbitrary blocks may be selected from a group of blocks in which the sequence number is relatively less.

In step 1102a, the compaction module 8 selects a block c in type X in which the number of valid pages is zero and the number of erases is less. As a method for selecting block c in which the number of erases is less, the block in which the number of erases is the least may be selected. Alternatively, an arbitrary block may be selected from a group of blocks in which the number of erases is relatively less.

In step 1103, the compaction module 8 moves the page data items in a valid state in a plurality of blocks b to block c.

In step 1104, the compaction module 8 updates the information corresponding to the moved page data items in the NAND block table 16. Specifically, the compaction module 8 updates the number of valid pages associated with block numbers corresponding to the source blocks b to which the target page data items are originally written in the NAND block table 16. When erasing has been performed for the source blocks b, the compaction module 8 updates the number of erases. The compaction module 8 updates the number of valid pages associated with a block number corresponding to block c as the move destination to which the target page data items are newly written in the NAND block table 16.

In step 1105, the compaction module 8 sets a sequence number corresponding to the source blocks b as a sequence number corresponding to block c, which is the move destination. Step 1105 may be included in step 1104. For example, when a plurality of sequence numbers corresponding to a plurality of source blocks b are present, the greatest sequence number is set as a sequence number corresponding to block c, which is the move destination.

In step 1106, the compaction module 8 updates the address translation table 17 based on control data described later. Specifically, the compaction module 8 sets a block number and a page number indicating the move destination relative to the logical address of each page data item to be moved in the address translation table 17.

Now, move compaction is explained.

In step 1101b, the compaction module 8 refers to the NAND block table 16, and selects a plurality of blocks b in type X in which the number of valid pages is not zero and the difference in sequence number exceeds a boundary value corresponding to type X in the boundary table 20. For example, when a large number of blocks in type X in which the number of valid pages is not zero and the difference in sequence number exceeds a boundary value are present, the compaction module 8 may preferentially select blocks in which the difference in sequence number is relatively large, or may select only a predetermined number of blocks at random.

In step 1102b, the compaction module 8 selects a block c in type X+1 in which the number of valid pages is zero and the number of erases is less.

The subsequent steps are the same as step 1103 to step 1106 described above. Thus, the explanation of the steps is omitted.

Figure 12:
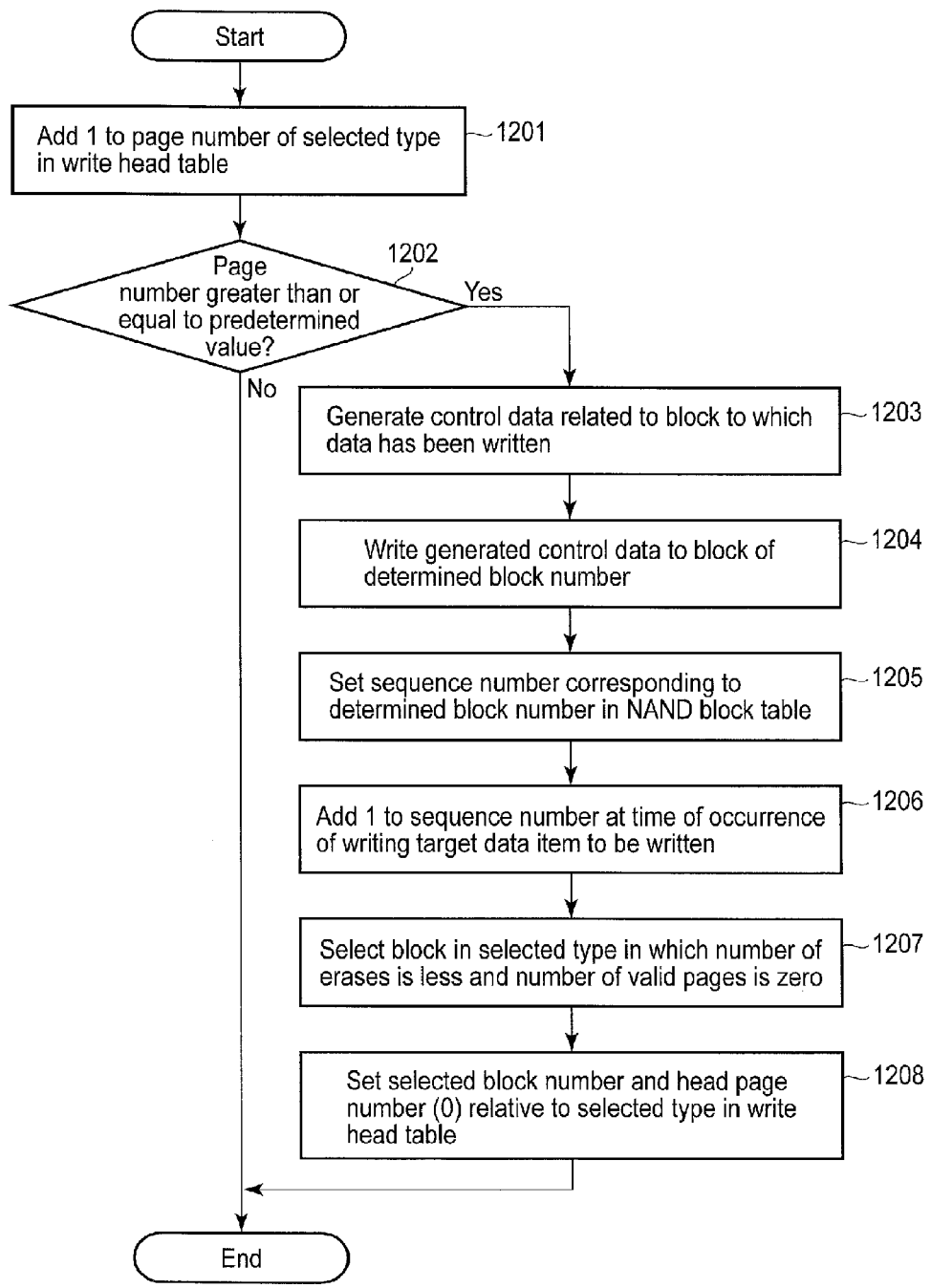
FIG. 12 is a flowchart showing an example of a process for updating the write head table, a sequence number in the NAND block table, and a sequence number at an time of occurrence of writing target data to be written.

FIG. 12 is a flowchart showing an example of a process (step 0706 in FIG. 7) for updating the write head table 15, a sequence number in the NAND block table 16, and the sequence number 18.

In step 1201, the write module 6 adds 1 to a page number corresponding to the selected type in the write head table 15.

In step 1202, the write module 6 determines whether a page number corresponding to the selected type is greater than or equal to a predetermined value (for example, the number of pages included in one block). When the page number is greater than or equal to the predetermined value, the process proceeds to step 1203. When the page number is less than the predetermined value, the process is terminated.

In step 1203, the write module 6 generates control data related to the block to which page data has been written.

In step 1204, the write module 6 writes the generated control data to the area indicated by the block number determined based on the selected type and the write head table 15. For example, the write module 6 writes the control data to the last page of the block indicated by the determined block number.

In step 1205, the write module 6 sets the sequence number 18 in a sequence number corresponding to the determined block number in the NAND block table 16.

In step 1206, the write module 6 adds 1 to the sequence number 18.

In step 1207, the write module 6 selects a block in the selected type in which the number of valid pages is zero and the number of erases is less. As a method for selecting a block in which the number of erases is less, for example, the block in which the number of erases is the least may be selected. Alternatively, an arbitrary block may be selected from a group of blocks in which the number of erases is relatively less.

In step 1208, the write module 6 sets the block number of the block selected in step 1207, and the head page number (for example, zero) of the selected block, relative to the selected type in the write head table 15.

FIG. 13 is a data structural diagram showing an example of control data. Control data 24 is used in the above compaction process and the above process for updating the write head table. In FIG. 13, the control data 24 written to NAND flash memory 22A is shown as an example. However, the same structure is applied to the control data written to the other NAND flash memories 22B, 22C and 23A to 23C.

The control data 24 is generated for each block. A plurality of page data items d1 to dN are written to each block. The control data 24 includes logical addresses of a plurality of page data items d1 to dN included in the block, and a sequence number corresponding to write-completion for the block. For example, the sequence number is provided in the last area of the control data 24. However, the position of the sequence number in the control data 24 may be arbitrarily changed.

FIG. 14 is a flowchart showing an example of a process (step 0708 in FIG. 7 and step 1104 in FIG. 11) for updating the NAND block table 16.

The process of FIG. 14 is a process for updating the NAND block table 16 occurred based on additional writing or a compaction process.

In step 1401, the write module 6 or the compaction module 8 refers to the address translation table 17, and determines the block numbers of the page data items invalidated by additional writing or move by a compaction process.

In step 1402, the write module 6 or the compaction module 8 decreases a number of valid pages corresponding to the determined block numbers only by the number of invalidated page data items in the NAND block table 16.

In step 1403, when a block in which the number of valid pages is changed to zero is present, the write module 6 or the compaction module 8 erases the block in which the number of valid pages is changed to zero. The write module 6 or the compaction module 8 adds 1 to the number of erases corresponding to the block number of the block in which the number of valid pages is changed to zero in the NAND block table 16.

In step 1404, the write module 6 or the compaction module 8 determines block numbers of blocks to which the page data items to be additionally written or moved by a compaction process are written.

In step 1405, the write module 6 or the compaction module 8 increases the number of valid pages corresponding to the determined block numbers only by the number of page data items to be written or moved in the NAND block table 16.

The characteristics of the present embodiment are specifically explained below.

In the present embodiment, the type of write destination is selected based on the difference in sequence number.

FIG. 15 is a flowchart showing an example of a process for selecting a type by the type selection module 10.

In step 1501, the type selection module 10 refers to the address translation table 17, and searches for the block number of the NAND flash memory to which the target page data item is written.

In step 1502, the type selection module 10 determines whether the block number of the target page data item is defined in the address translation table 17.

When the block number of the target page data item is not defined, the process proceeds to step 1503. When the block number of the target page data item is defined, the process proceeds to step 1504.

In step 1503, the type selection module 10 selects type C, in which the upper limit in the number of erases is the least. If the information for address translation is not defined in the address translation table 17 regarding a target page data item to be written, the page data item is a new data item. The type selection module 10 determines that the write interval for a new target page data item is long, and selects type C suitable for storage of data having a long write interval.

In step 1504, the type selection module 10 refers to the NAND block table 16, and determines a sequence number corresponding to the retrieved block number.

In step 1505, the type selection module 10 calculates the difference in sequence number between the sequence number 18 and the determined sequence number, and transmits the calculated difference in sequence number to the histogram generation module 11. To reduce the load on the histogram generation module 11, the number of transmissions of the difference in sequence number may be decreased to one in comparison with the M calculations of the difference in sequence number.

In step 1506, the type selection module 10 determines a type corresponding to the calculated difference in sequence number based on the boundary values set in the boundary table 20.

In step 1507, the type selection module 10 selects the NAND flash memory in the determined type as the write destination of the page data item.

The boundary values of the boundary table 20 used in the above process for selecting a type are set by a process for generating a histogram by the histogram generation module 11 and a process for setting a boundary by the boundary setting module 12. This specification explains a process for generating a histogram and a process for setting a boundary below with reference to FIG. 16 to FIG. 19.

Figure 16:
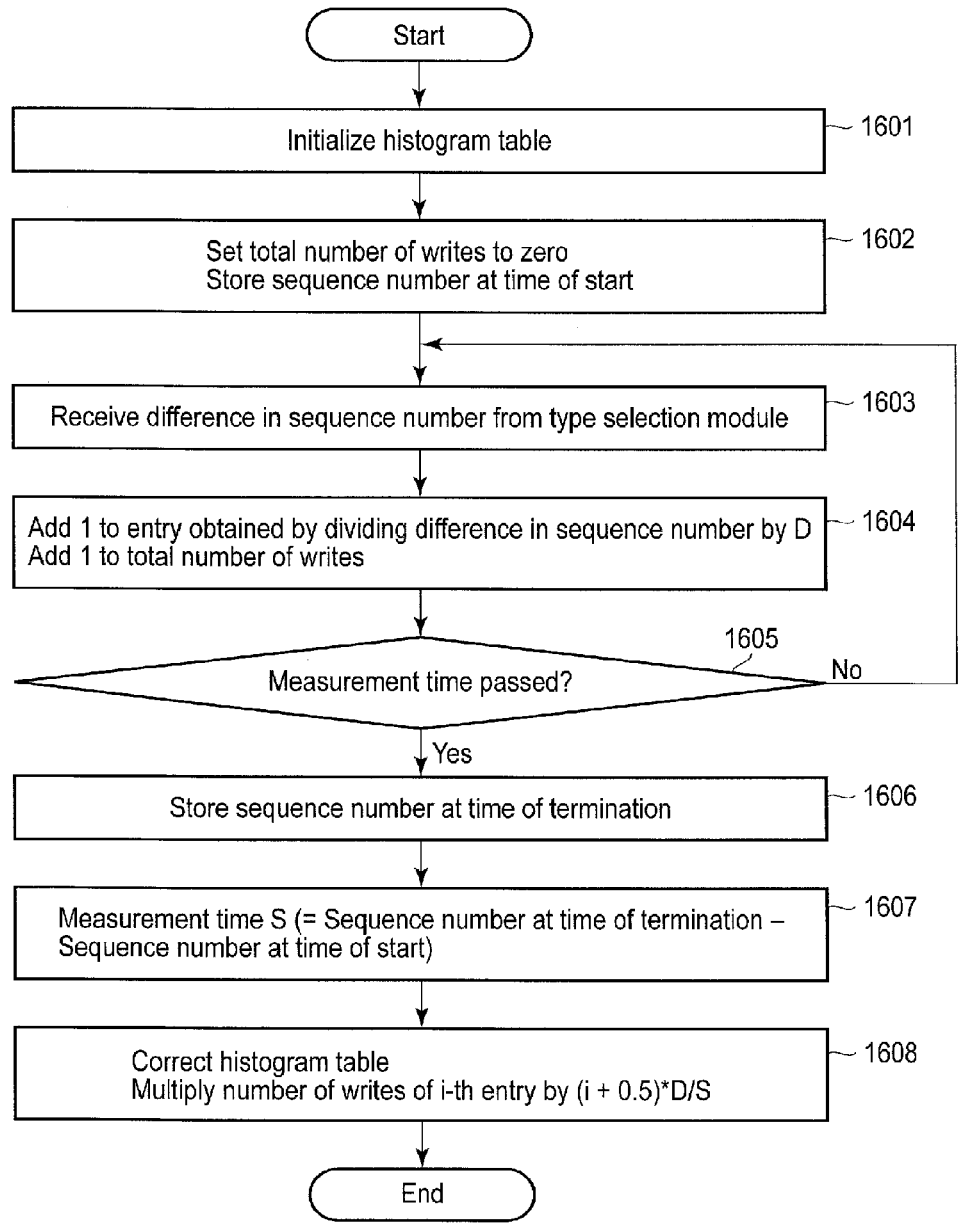
FIG. 16 is a flowchart showing an example of a process for generating a histogram.

FIG. 16 is a flowchart showing an example of a process for generating a histogram.

In step 1601, the histogram generation module 11 initializes the histogram table 19 stored in the memory 14.

In step 1602, the histogram generation module 11 sets the total number of writes (in other words, the total number of samples) of the histogram table 19 to zero, and stores the sequence number at the time of start in the memory 14.

In step 1603, the histogram generation module 11 receives the difference in sequence number from the type selection module 10.

In step 1604, the histogram generation module 11 adds 1 to the number of writes corresponding to the received sequence number, and adds 1 to the total number of writes. For example, the histogram generation module 11 increases the number of writes corresponding to the range to which the "difference in sequence number/D", as the value obtained by dividing the difference in sequence number by the bin width (bin range) D of the histogram, belongs. The histogram generation module 11 further increases the total number of writes.

In step 1605, the histogram generation module 11 determines whether a predetermined measurement time has passed. When the predetermined measurement time has passed, the process proceeds to step 1606. When the predetermined measurement time has not passed, the process returns to step 1603.

In step 1606, the histogram generation module 11 stores the sequence number at the time of termination in the memory 14.

In step 1607, the histogram generation module 11 calculates a measurement period S (=sequence number at the time of termination−sequence number at the time of start).

In step 1608, the histogram generation module 11 corrects the histogram table 19 based on the bin width D and the measurement period S. For example, the histogram generation module 11 multiplies the number of writes of the i-th entry of the histogram table 19 by "(i+0.5)×D/S" after the measurement time S, and corrects the histogram table 19. As the greater i is, the larger "difference in sequence number/D" the entry has.

FIG. 17 is a graph showing an example of correction of the histogram table 19.

In the histogram table 19, scaling has been applied to the difference in sequence number by the bin width D. The number of writes is counted for the "difference in sequence number/D", which is the difference in sequence number to which scaling has been applied. In FIG. 17, the "differences in sequence number/D" in the histogram table 19 represent bins (on the horizontal axis), and the number of writes represents the frequency (on the vertical axis). Data in which the "difference in sequence number/D" is small has a short write interval. Data in which the "difference in sequence number/D" is large has a long write interval. Since the measurement period S is short, a large number of writes are measured by one data item regarding data items in which the write interval is short. Regarding data items in which the write interval is long, a small number of writes are measured by one data item. In the present embodiment, the number of writes of each entry of the histogram table 19 is multiplied by "(i+0.5)×D/S". Thus, translation into the amount of data for each write interval is performed. In the measurement time S, the less i is, the less "(i+0.5)×D/S" is. The greater i is, the greater "(i+0.5)×D/S" is. In this manner, the number of writes is multiplied by a less value as i becomes less. The number of writes is multiplied by a greater value as i becomes greater.

FIG. 18 is a flowchart showing an example of a process for setting a boundary.

FIG. 19 is a graph showing the relationship between a histogram and indexes I and J.

In step 1801, the boundary setting module 12 obtains the effective capacity of NAND flash memories 22A and 23A in type A. For example, the effective capacity is the amount of data which can be reasonably stored in each NAND flash memory with room.

In step 1802, the boundary setting module 12 increases the number of writes in the histogram table 19 in order in a direction in which the "difference in sequence number/D" is increased from the minimum bin (the smallest "difference in sequence number/D") of the histogram. The boundary setting module 12 obtains an integration value by multiplying the additional value by a page size writable. The boundary setting module 12 obtains index I as the "difference in sequence number/D" in which the integration value exceeds the effective capacity of type A.

In step 1803, the boundary setting module 12 determines the value of "(I−1)×D" obtained based on indexes I and D as the boundary value for type A in the boundary table 20.

In step 1804, the boundary setting module 12 obtains the effective capacity of NAND flash memories 22B and 23B in type B.

In step 1805, the boundary setting module 12 increases the number of writes in the histogram table 19 in order in a direction in which the "difference in sequence number/D" is increased from the I-side of the "difference in sequence number/D". The boundary setting module 12 obtains an integration value by multiplying the additional value by a page size writable, and obtains index J as the "difference in sequence number/D" in which the integration value exceeds the effective capacity of type B.

In step 1806, the boundary setting module 12 determines the value of "(J−1)×D" obtained based on indexes J and D as the boundary value for type B in the boundary table 20.

In step 1807, the boundary setting module 12 associates −1 indicating that no upper limit is set with type C in the boundary table 20.

For example, the effective capacity of each type of NAND flash memory is set to a value greater than or equal to ⅔ of the physical capacity and less than or equal to ¾ of the physical capacity. For example, when the physical capacity of NAND flash memories 22A and 23A in type A is 1000000 gigabytes, the effective capacity is greater than or equal to 666666 gigabytes and less than or equal to 750000 gigabytes. For example, when the physical capacity of NAND flash memories 22B and 23B in type B is 2000000 gigabytes, the effective capacity is greater than or equal to 1333333 gigabytes and less than or equal to 1500000 gigabytes.

For example, counting is applied to the entry of the histogram table 19 page by page. However, when the M transmissions from the type selection module 10 to the histogram generation module 11 is decreased to one, counting is applied in increments of M pages.

FIG. 20 is a flowchart showing an example of a process for determining the writable life of each of types A to C by the life determination module 13.

In step 2001, the life determination module 13 determines the writable life of, for example, NAND flash memories 22A and 23A in type A.

In step 2002, the life determination module 13 determines the writable life of, for example, NAND flash memories 22B and 23B in type B.

In step 2003, the life determination module 13 determines the writable life of, for example, NAND flash memories 22C and 23C in type C.

FIG. 21 is a flowchart showing an example of a process for determining the writable life of a specific type. The target type for a process for determining the writable life is referred to as X. Type X is equivalent to one of types A to C.

In step 2101, the life determination module 13 refers to, for example, the NAND block table 16, and calculates the amount of data which can be written to each NAND flash memory in type X in the measurement period S for generating a histogram based on the data capacity of each NAND flash memory in type X, the upper limit in the number of erases in type X, and the number of erases in the blocks of type X in the NAND block table 16.

In step 2102, the life determination module 13 calculates the amount of data which is actually written to each NAND flash memory in type X in the measurement period S based on the histogram table 19. For example, the life determination module 13 increases the number of writes in a range corresponding to type X in the histogram table 19, and multiples the additional value by a page size. In this way, the life determination module 13 calculates the amount of data which is actually written to each NAND flash memory in type X.

In step 2103, the life determination module 13 determines whether the amount of data which is actually written to each NAND flash memory in type X in the measurement period S is greater than the amount of data which can be written to each NAND flash memory in type X in the measurement period S.

When the amount of data which is actually written is greater than the amount of data which can be written, the process proceeds to step 2104.

When the amount of data which is actually written is less than or equal to the amount of data which can be written, the process is terminated.

In step 2104, the life determination module 13 determines that the difference between the amount of data which is actually written to each NAND flash memory in type X in the measurement period S and the amount of data which can be written to each NAND flash memory in type X in the measurement period S is the physical capacity of type X to be added. The life determination module 13 sends back the physical capacity of type X to be added and an alert notification to the host device 3.

In the present embodiment explained above, the difference in sequence number indicating the write interval is calculated at the time of writing data. The type for writing data is determined based on the difference in sequence number. Data in which the write interval is short is written to NAND flash memories 22A and 23A in type A in which the upper limit in the number of erases is great. Data in which the write interval is intermediate is written to NAND flash memories 22B and 23B in type B in which the upper limit in the number of erases is intermediate. Data in which the write interval is long is written to NAND flash memories 22C and 23C in type C in which the upper limit in the number of erases is less.

Thus, in the present embodiment, it is possible to extend the writable life of NAND flash memories 22A to 22C and 23A to 23C in types A to C.

In the present embodiment, even when the number of types is three or more, it is possible to select a NAND flash memory as the write destination by making the write interval conform to the upper limit in the number of erases.

In the present embodiment, the difference in sequence number is managed for each block. The difference in sequence number is the difference between the sequence number 18 and the sequence number at the time of write-completion for the block to which data is written. The sequence number at the time of write-completion for the block is managed in, for example, the NAND block table 16. The amount of data necessary for the control of the present embodiment is nearly the data amount of the NAND block table 16. In a comparative example, the number of writes for each page data item is counted. Based on the number of writes for each page data item, the write frequency of each page data item is calculated. Based on the write frequency, the write destination of each page data item is determined. In the present embodiment, the write destination of data can be selected with storage capacity less than that of the comparative example. For example, when the block size of NAND flash memories 22A to 22C and 23A to 23C is 4 megabytes, and the storage capacity of storage modules 22 and 23 is 100 terabytes, various types of data items 15 to 20 can be managed with approximately 500 megabytes in the present embodiment. However, when the number of writes for each page data item is counted in the way of the comparative example, the storage capacity must be at least approximately 100 gigabytes to manage the data items.

In the present embodiment, the type of write destination is selected based on the difference in sequence number. Therefore, it is possible to detect and deal with the change in the situation more immediately than the comparative example in which the write frequency is calculated after the number of writes of data is counted.

In the present embodiment, a histogram indicating the relationship between the difference in sequence number and the number of writes is generated. The number of writes is increased from the side on which the difference in sequence number is small. In this way, a boundary value corresponding to the effective capacity of each NAND flash memory can be obtained. Based on the obtained boundary value and the difference in sequence number, the type of write destination is selected. Thus, it is possible to write data equivalent to the effective capacity to each NAND flash memory.

In the present embodiment, it is possible to compare the amount of data which can be written to various types of NAND flash memories 22A to 22C and 23A to 23C with the amount of data which is actually written based on the histogram of the number of writes relative to the difference in sequence number. Thus, it is possible to output the insufficient memory capacity and immediately add a new NAND flash memory.

In the present embodiment, the sequence number 18 is increased when writing has been completed for a block. However, for example, the sequence number 18 may be decreased from a predetermined value when writing has been completed for a block. In other words, the sequence number 18 should be changed such that the order of writing blocks can be recognized.

Second Embodiment

In the present embodiment, a modification example of the storage device of the first embodiment is explained.

In the present embodiment, this specification explains the following storage device. When a plurality of NAND flash memories are provided in a type, the storage device prevents the life of the NAND flash memories in the type ending at substantially the same time.

In the present embodiment, this specification explains the storage device which performs wear leveling among types.

FIG. 22 is a block diagram showing an example of the configuration of a computer system including the storage device of the second embodiment.

A computer system 26 includes a storage device 27. The storage device 27 includes a controller 28. The controller 28 includes a type controller 29. The type controller 29 includes a pseudo-type setting module 30 and a type wear leveling module 31 in addition to the same structures as the type controller 9 of the first embodiment.

The pseudo-type setting module 30 newly sets a pseudo-type for a part of NAND flash memories in a type. For example, the pseudo-type setting module 30 determines whether a range of the difference in sequence number corresponding to types A to C has two or more peaks in the number of writes based on the histogram table 19. The pseudo-type setting module 30 divides a type including two or more peaks in the number of writes into two or more divisional areas, and sets the difference in sequence number corresponding to the two or more divisional areas in the boundary table 20.

The type wear leveling module 31 performs wear leveling among different types of NAND flash memories. For example, the type wear leveling module 31 calculates the degree of wear of each block included in types A to C based on the upper limit in the number of erases in types A to C and the NAND block table 16, temporarily sets a type having a long write interval in a block in which the degree of wear is high, and sets a type having a short write interval in a block in which the degree of wear is low.

FIG. 23 is a flowchart showing an example of a process for setting a pseudo-type by the pseudo-type setting module 30.

In step 2301, the pseudo-type setting module 30 searches for a peak in the number of writes for each range of the "difference in sequence number/D" corresponding to types A to C based on the histogram table 19.

In step 2302, the pseudo-type setting module 30 determines whether two or more peaks are present in at least one of ranges corresponding to types A to C.

When two or more peaks are not present in any of ranges corresponding to types A to C, the process is terminated.

When two or more peaks are present in one of ranges corresponding to types A to C, the process proceeds to step 2303.

In step 2303, the pseudo-type setting module 30 determines whether pseudo-type setting is valid for a type having two or more peaks.

For example, the pseudo-type setting module 30 confirms the number of peaks, the number of NAND flash memories of the type having two or more peaks, or the speed for reaching the upper limit in the number of writes in the type having two or more peaks. Thus, the pseudo-type setting module 30 determines whether pseudo-type setting is valid. More specifically, for example, the pseudo-type setting module 30 determines that pseudo-type setting is valid when a plurality of NAND flash memories are provided in the type having two or more peaks, and further when the amount of writing to the type having two or more peaks is greater than the amount of writing to the other types, and further when it is determined that the type having two or more peaks reaches the upper limit in the number of writes earlier than the other types.

When it is determined that pseudo-type setting is valid, the process proceeds to step 2304. When it is determined that pseudo-type setting is not valid, the process is terminated.

In step 2304, the pseudo-type setting module 30 divides the type in which pseudo-type setting is valid as a result of determination such that two peaks in the number of writes correspond to different types, respectively. The pseudo-type setting module 30 sets the types newly increased by the division as pseudo-types in the NAND block table 16, the boundary table 20 and the write head table 15.

FIG. 24 is a graph showing an example of a pseudo-type. FIG. 24 shows an example in which it is determined that pseudo-type setting is valid for type B. In the histogram shown by the histogram table 19, two peaks are present in a range of the "difference in sequence number/D" corresponding to type B.

For example, the pseudo-type setting module 27 divides type B into pseudo-type A' and type B, determining that the "difference in sequence number/D" which is the minimum value of the number of writes in the range of the "difference in sequence number/D" corresponding to type B as the boundary value.

The pseudo-type setting module 27 sets the information of pseudo-type A' in the NAND block table 16, the boundary table 20 and the write head table 15 based on the block number, the type and the number of erases in the NAND block table 16, the boundary value of pseudo-type A', etc. The pseudo-type setting module 27 updates the NAND block table 16, the boundary table 20 and the write head table 15.

For example, the pseudo-type setting module 27 sets pseudo-type A' for the blocks of a group in which the number of erases is great out of the blocks of type B before change. The pseudo-type setting module 27 maintains type B for the blocks of a group in which the number of erases is less.

FIG. 25 is a data structural diagram showing an example of the NAND block table 16 in which a pseudo-type is set.

In the NAND block table 16, type B before change is divided into pseudo-type A' and type B after change.

The difference in sequence number corresponding to pseudo-type A' is present between the difference in sequence number corresponding to type A and the difference in sequence number corresponding to type B. Thus, there is a high possibility that the number of erases in a block of pseudo-type A' is present between the number of erases in a block of type A and the number of erases in a block of type B.

In the NAND block table 16, block numbers 1000000 to 1999999 which are previously type B are changed to pseudo-type A'.

FIG. 26 is a data structural diagram showing an example of the boundary table 20 in which a pseudo-type is set.

To the boundary table 20, an entry related to type A' is added.

In the boundary table 20, 4000000 is set as the boundary value (upper limit) of type A'. When the difference in sequence number calculated at the time of writing a target page data item is 2000001 to 4000000, type A' which is the write destination of the page data item is selected using the boundary table 20.

FIG. 27 is a data structural diagram showing an example of the write head table 15 in which a pseudo-type is set.

To the write head table 15, an entry related to type A' is added.

The write head table 15 shows that writing for type A' is performed for page number 0 of block number 1000000.

Figure 28:
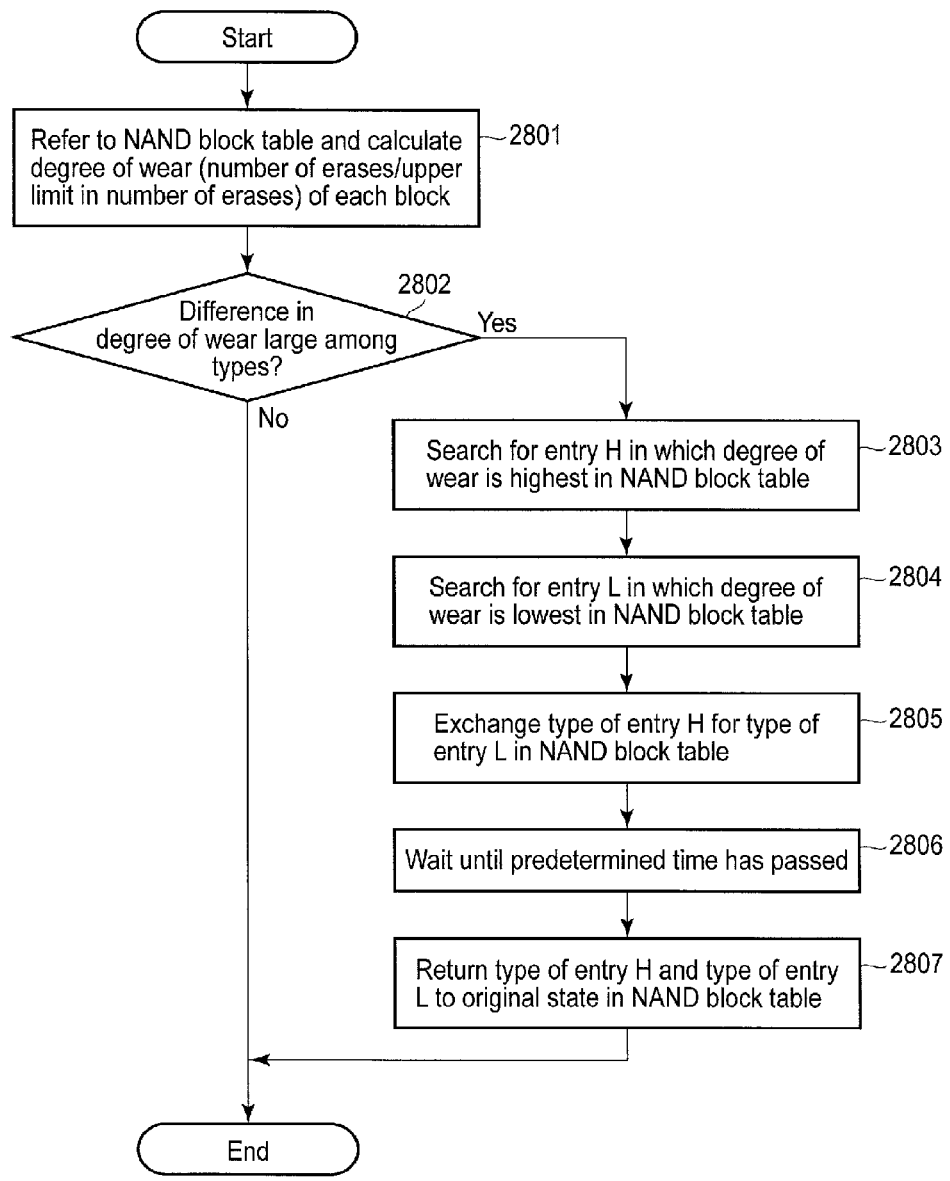
FIG. 28 is a flowchart showing an example of a process for wear leveling among types.

FIG. 28 is a flowchart showing an example of a process for wear leveling among types by the type wear leveling module 31.

In step 2801, the type wear leveling module 31 refers to the NAND block table 16, and calculates the degree of wear defined by "the number of erases/the upper limit" in the number of erases in each block.

In step 2802, the type wear leveling module 31 determines whether the difference in the degree of wear is large among different types. For example, the type wear leveling module 31 compares the maximum values of the degree of wear of the types. The type wear leveling module 31 determines how large the difference in the degree of wear is on the basis of whether the difference in the maximum value of the degree of wear exceeds a threshold set in advance. For example, the type wear leveling module 31 may calculate the mean value of the degree of wear of the types and determine how large the difference in the degree of wear is on the basis of whether the difference in the mean value of the degree of wear exceeds the threshold set in advance.

When the difference in the degree of wear is small among the types, the process is terminated.

When the difference in the degree of wear is large among the types, the process proceeds to step 2803.

In step 2803, the type wear leveling module 31 searches for entry H in which the degree of wear is the highest in the NAND block table 16.

In step 2804, the type wear leveling module 31 searches for entry L in which the degree of wear is the lowest in the NAND block table 16.

In step 2805, the type wear leveling module 31 exchanges the type of entry H for the type of entry L in the NAND block table 16.

In step 2806, the type wear leveling module 31 waits until a predetermined time has passed.

In step 2807, the type wear leveling module 31 returns the type of entry H and the type of entry L to the original state in the NAND block table 16. The process is terminated.

In the above process for wear leveling among types, the order of steps may be arbitrarily changed. For example, step 2803 and step 2804 may be swapped in the order. Alternatively, these steps may be performed concurrently.

In the present embodiment explained above, a histogram indicating the relationship between the difference in sequence number and the number of writes is generated. When a range corresponding to a type has two or more peaks in the histogram, and further when division of the type having two or more peaks is statistically appropriate, a pseudo-type is newly set, and the blocks of the same type are divided into different types. Thus, the number of types is increased. In this manner, it is possible to decrease the number of NAND flash memories which are required to be replaced at the same time.

In the present embodiment, data items having substantially the same difference in sequence number are written to the same type of NAND flash memory.

In the above process for setting a pseudo-type, when two or more peaks are present in a type in the histogram, a plurality of areas (for example, blocks) of one NAND flash memory which belongs to the type may be divided into a plurality of types. A plurality of NAND flash memories which belong to the type may be divided into a plurality of types. For example, a pseudo-type may be set for a part of the areas of one NAND flash memory. The original type may be maintained in the other areas. By collecting data items having the same difference in sequence number to the same area in one NAND flash memory, the efficiency of compaction can be increased. Thus, compaction can be optimized.

According to the present embodiment, in a process for wear leveling among types, the type of block in which the degree of wear is high is temporarily exchanged for the type of block in which the degree of wear is low among different types of NAND flash memories. In this way, data in which the write interval is long is allocated to a block in which the degree of wear is high. Data in which the write interval is short is allocated to a block in which the degree of wear is low. Thus, the degree of wear can be equalized among different types of blocks including a pseudo-type. The life of NAND flash memories 22A to 22C and 23A to 23C can be extended.

In each of the above embodiments, tables 15 to 17, 19 and 20 may be arbitrarily combined with each other or divided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
    a storage module including a plurality of areas having different upper limits in the number of erases;
    a management storage module which stores first management data in which a sequence number indicating an order of write-completion is associated with each erase unit area included in the plurality of areas, second management data indicating a relationship between each write interval and each write destination area, and address translation data in which a logical address is associated with the erase unit area;

a selection module which, when target data to be written is written to the storage module, obtains the erase unit area corresponding to the logical address of the target data to be written based on the address translation data, calculates a write interval of the target data to be written from a difference between the sequence number at a time of occurrence of writing the target data to be written and the sequence number corresponding to the erase unit area of the first management data based on the first management data, and selects the write destination area corresponding to the write interval of the target data to be written based on the second management data; and a write module which writes the target data to be written to the write destination area selected by the selection module, and changes the sequence number when writing is completed for one erase unit area.

2. The storage device of claim 1, further comprising:

a histogram generation module which generates histogram data indicating the number of writes corresponding to each write interval; and a boundary setting module which obtains, based on the histogram data, a boundary value of a write interval corresponding to a first area in which the upper limit in the number of erases is great out of the plurality of areas such that an amount of data written to the first area is equivalent to an effective capacity of the first area, the boundary setting module further setting the boundary value in the second management data.

3. The storage device of claim 2, wherein the number of erases is associated with each erase unit area in the first management data, and the storage device further comprises a life determination module which calculates a first amount of data which is allowed to be written to the plurality of areas in a measurement period based on a data capacity of the plurality of areas, the upper limit in the number of erases in the plurality of areas, and the number of erases in the first management data, calculates a second amount of data written in the measurement period based on the histogram data, and outputs an alert when the second amount of data is greater than the first amount of data.

4. The storage device of claim 2, further comprising an area setting module which determines whether a range of a write interval corresponding to the plurality of areas has two or more peaks in the number of writes based on the histogram data, divides an area including two or more peaks in the number of writes into two or more divisional areas, and sets a write interval corresponding to the two or more divisional areas in the second management data.

5. The storage device of claim 1, wherein the number of erases is associated with each erase unit area in the first management data, and the storage device further comprises a wear leveling module which calculates a degree of wear of each erase unit area included in the plurality of areas based on the upper limit in the number of erases in the plurality of areas and the number of erases in the first management data, and temporarily exchanges writing for an erase unit area in which the degree of wear is high for writing for an erase unit area in which the degree of wear is low.

6. A method for controlling a storage device comprising a storage module including a plurality of areas having different upper limits in the number of erases, the method comprising:

storing, in the storage device, first management data in which a sequence number indicating an order of write-completion is associated with each erase unit area included in the plurality of areas, second management data indicating a relationship between each write interval and each write destination area, and address translation data in which a logical address is associated with the erase unit area;

obtaining, when target data to be written is written to the storage module, the erase unit area corresponding to the logical address of the target data to be written based on the address translation data, calculating a write interval of the target data to be written from a difference between the sequence number at a time of occurrence of writing the target data to be written and the sequence number corresponding to the erase unit area of the first management data based on the first management data, and selecting the write destination area corresponding to the write interval of the target data to be written based on the second management data, and writing the target data to be written to the selected write destination area, and increasing the sequence number when writing is completed for one erase unit area.

7. A computer-readable nonvolatile storage medium for storing a program for causing a computer to function as:

a controller which stores, in a storage device comprising a storage module including a plurality of areas having different upper limits in the number of erases, first management data in which a sequence number indicating an order of write-completion is associated with each erase unit area included in the plurality of areas, second management data indicating a relationship between each write interval and each write destination area, and address translation data in which a logical address is associated with the erase unit area;

a selection module which, when target data to be written is written to the storage module, obtains the erase unit area corresponding to the logical address of the target data to be written based on the address translation data, calculates a write interval of the target data to be written from a difference between the sequence number at a time of occurrence of writing the target data to be written and the sequence number corresponding to the erase unit area of the first management data based on the first management data, and selects the write destination area corresponding to the write interval of the target data to be written based on the second management data; and a write module which writes the target data to be written to the write destination area selected by the selection module, and changes the sequence number when writing is completed for one erase unit area.

* * * * *